US007045276B2

(12) United States Patent
Takahashi et al.

(10) Patent No.: US 7,045,276 B2
(45) Date of Patent: *May 16, 2006

(54) HYDROPHILIC MEMBER PRECURSOR AND PATTERN FORMING MATERIAL THAT UTILIZES IT, SUPPORT FOR PLANOGRAPHIC PRINTING PLATE, AND PLANOGRAPHIC PRINTING PLATE PRECURSOR

(75) Inventors: Miki Takahashi, Shizuoka-ken (JP); Koichi Kawamura, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 18 days.

This patent is subject to a terminal disclaimer.

(21) Appl. No.: 10/268,095

(22) Filed: Oct. 10, 2002

(65) Prior Publication Data

US 2003/0186162 A1 Oct. 2, 2003

(30) Foreign Application Priority Data

Oct. 11, 2001 (JP) ............................. 2001-314360
Oct. 11, 2001 (JP) ............................. 2001-314363
Oct. 11, 2001 (JP) ............................. 2001-314366
Dec. 7, 2001 (JP) ............................. 2001-374021

(51) Int. Cl.
*G03F 7/027* (2006.01)
*G03F 7/038* (2006.01)
*G03F 7/11* (2006.01)
*G03F 7/14* (2006.01)
*C08J 7/04* (2006.01)

(52) U.S. Cl. ................ 430/302; 430/271.1; 430/273.1; 430/286.1; 430/287.1; 430/138; 430/322; 430/270.1; 427/504; 427/505; 427/510; 427/516

(58) Field of Classification Search ................ 430/138, 430/270.1, 271.1, 286.1, 302, 287.1, 927, 430/273.1, 322; 101/453; 427/504, 505, 427/510, 516
See application file for complete search history.

(56) References Cited

U.S. PATENT DOCUMENTS 5,889,073 A 3/1999 Zhang et al.
6,306,492 B1 10/2001 Yamada et al.
6,566,029 B1 * 5/2003 Kawamura et al. .......... 430/138
6,593,059 B1 * 7/2003 Kawamura et al. ...... 430/270.1
6,607,866 B1 * 8/2003 Kawamura et al. ...... 430/270.1

FOREIGN PATENT DOCUMENTS

DE 1 145 135 3/1963
EP 1 302 504 A1 4/2003
EP 1 400 544 A1 3/2004
JP 4-305450 10/1992
JP 6-18706 A 1/1994
JP 7-1849 A 1/1995
JP 0709228 10/1995
JP 8-292558 11/1996
JP 10-17688 A 1/1998
JP 11-43614 A 2/1999
JP 11-84658 A 3/1999
JP 11-119413 A 4/1999
JP 11-129404 5/1999
JP 2828374 B2 9/1999
JP 2000-80189 A 3/2000
JP 2001-166491 A 6/2001
JP 2002-273209 A 9/2002
JP 2002-283530 A 10/2002
JP 2002-324966 A 11/2002

OTHER PUBLICATIONS

Hiroo Iwata, "Surface Graft Reaction on Separation Membrane and Dynamic Function of Grafted Chains" Surface, vol. 32, No. 3 (1994) pp. 28-34, published by Koushinsha.
Martin S. Kunz, et al., "Colloidal Gold Dispersions in Polymeric Matrices", Journal of Colloid and Interface Science 156, pp. 240-249 (1993) published by Academic Press, Inc.
Y. Nakayama and T. Matsuda; Surface Macromolecular Microarchitecture Design: Biocompatible Surfaces via Photo-Block-Graft-Copolymerization Using N,N-Diethyldithiocarbamate; Langmuir 1999, 15, 5560-5566.
Enoch Kim, Younan Xia, and George M. Whitesides; Two- and Three-Dimensional Crystallization of Polymeric Microspheres by Micromolding in Capillaries; Advanced Materials, vol. 8, No. 3, 1996, pp. 245-247.

* cited by examiner

*Primary Examiner*—Richard L. Schilling
(74) *Attorney, Agent, or Firm*—Sughrue Mion, PLLC

(57) ABSTRACT

The invention provides a hydrophilic member precursor having a hydrophilic surface that is formed by contacting a hydrophobic polymer-containing layer formed on a substrate with a composition that contains a polymerizing group-having hydrophilic polymer followed by applying energy thereto to thereby directly chemically bond the polymerizing group-having hydrophilic polymer to the hydrophobic polymer-containing layer. The invention also provides a hydrophilic member from the hydrophilic member precursor, as well as a pattern forming material, a support for planographic printing plates, and a planographic printing plate precursor.

7 Claims, No Drawings

HYDROPHILIC MEMBER PRECURSOR AND PATTERN FORMING MATERIAL THAT UTILIZES IT, SUPPORT FOR PLANOGRAPHIC PRINTING PLATE, AND PLANOGRAPHIC PRINTING PLATE PRECURSOR

BACKGROUND OF THE INVENTION

1. Field of the Invention

The present invention relates to a highly hydrophilic member precursor of many applications and to a hydrophilic member obtainable by utilization of said precursor. The invention also relates to a pattern forming material that utilizes the hydrophilic member and can easily form images of high resolution, to a support a highly hydrophilic surface for planographic printing plates, and to a planographic printing plate precursor capable of forming high-quality images with no stains in the non-image area thereof.

2. Description of the Related Art

Hydrophilicating various types of members on their surfaces endows them with many applications. Specific examples of such surface-hydrophilicated members include formed articles not almost absorbing proteins, colloids, bacteria, humins, oils and fats, and pollutants in air and other biocompatible shaped articles that are used in fields such as the food industry, medical treatment (including medical devices such as artificial organs, and for diagnosis), pharmaceutical industry, waste treatment, painting and printing; carriers for fixation not degrading enzymes and microbial cells; antifogging structures such as defrosting films and defrosting membranes to be used in the field of trading, agriculture, transportation, household appliances, optical instruments and coating compositions; and surface-hydrophilicated structures for static charge prevention usable in the field of electronic industry.

The surface characteristics necessary for those hydrophilic structures to be used in the various fields mentioned above are that their surfaces do not adsorb unfavorable substances such as proteins, oils, fats and humins; that they do not fog, they are biocompatible, and they are antistatic. High hydrophilicity realizes such their functions. For example, in the field of coating compositions, used are anti-soiling films that do not adsorb oily substances in rain; and especially for sensor surfaces, the coating compositions are required not to specifically adsorb such oily substances. When liquid drops adhere to antifogging films of high hydrophilicity, they may spread on the film surfaces and will widely wet the films. Therefore, such antifogging films are required not only to have high hydrophilicity but also to have high optical transparency and surface smoothness. Biocompatible articles for use in the field of medical treatment, for example, those for artificial organs are required to have surfaces not causing thrombosis, hemolysis, sensitization and antigen-antibody reaction. Structures that are hydrophilic and are therefore antistatic are especially important in the field of electronic industry.

Surface grafting with a hydrophilic monomer is one example of surface hydrophilication known in the art that satisfies these requirements.

Specifically, Japanese Patent Application Laid-Open (JP-A) No. 53-17407 discloses a method that comprises applying a hydrophilic radical-polymerizing compound to the surface of an oleophilic substrate of which the essential ingredient is an oleophilic resin having a predetermined amount of a hydrogen atom bonded to a carbon-carbon double bond and/or a tertiary carbon, followed by exposing the thus-coated substrate to active rays to thereby form a hydrophilic surface layer on the surface of the substrate. JP-A No. 10-53658 discloses a method for producing a shaped article having a hydrophilic surface, which comprises contacting (B) a hydrophilic layer-forming material that contains (b) a hydrophilic monomer and/or a hydrophilic oligomer with a photopolymerizing resin composition that contains indispensable ingredients of a monomer and/or an oligomer capable of polymerizing through exposure to active rays and a photopolymerization initiator, followed by exposing the thus-contacted two to active rays to thereby copolymerize the photopolymerizing resin composition (A) with the hydrophilic monomer and/or the hydrophilic oligomer in the hydrophilic layer-forming material (B) at the interface of the two.

In the method of producing surface-hydrophilic shaped articles disclosed by JP-A No. 53-17407, the hydrophilic surface layer is easy to form. However, the method is problematic in that that it is often difficult to uniformly coat the oleophilic substrate with such a hydrophilic radical-polymerizing compound of low film formability. Therefore, in the method, the substrate is often unevenly coated with the compound, and, as a result, the hydrophilicity of the hydrophilic surface layer formed on the substrate is often low. In the method disclosed by JP-A No. 10-53658, the support is exposed to light while dipped in a hydrophilic layer-forming material to thereby form a hydrophilic layer thereon. Therefore, the method is disadvantageous in point of the process latitude. In particular, when a shaped article of a filmy substrate coated with a hydrophilic layer is produced according to the method, the surface smoothness of the article produced is often poor.

Heretofore, various image-forming materials are used for display materials and pattern forming materials. In general, images are formed in these materials by imagewise adhering a colorant material such as ink to the surface of a white image-receiving material such as paper, or by imagewise adhering a light-impervious material such as pigment to a transparent image-receiving material such as plastic film.

Various methods of image formation are known, for example, comprising adhering ink to an image-receiving material in a mode of inkjet printing, or comprising electrostatically adhering a colorant to the surface of an image-forming material followed by heating it for image fixation thereon, typically as in copiers, or comprising imagewise coloring a dye precursor in a thermal recording material.

For forming fine patterns of controlled orientation, for example, JP-A No. 2000-247799 proposes a method of forming a thin film of functional organic molecules. The method produces fine patterns, in which, however, the image-forming material must be exposed to UV rays through a mask such as a lith film for writing imagewise patterns thereon, like in a method of image formation on conventional planographic printing plate precursors. Therefore, the method requires complicated steps for image formation.

In ordinary image-forming methods heretofore known in the art, it is difficult to form images of high resolution on large-area image-forming materials and to form images of high density on thin-film image-forming materials.

A printing plate having an ink-receiving oleophilic region and an ink-repellent region (hydrophilic resin) to receive not ink but dampening water is used in lithography, and various types of photosensitive planographic printing plate precursors (PS precursors) are used for it.

One type of PS precursors now widely used in practice has a photosensitive layer formed on a support such as an aluminium plate. The PS precursor of the type is imagewise exposed and developed to remove the photosensitive layer in the non-image area, and the thus-processed plate is used in printing, based on the hydrophilicity of the substrate surface and the hydrophobicity of the photosensitive layer in the image area. The substrate surface of the PS precursor must be highly hydrophilic for preventing the non-image area thereof from being stained.

For the hydrophilic substrate or the hydrophilic layer of planographic printing plates, heretofore generally used are aluminium plates having been subjected to anodic oxidation to form an oxide film thereon, or the oxide film-coated aluminium plates are silicated for further increasing their hydrophilicity. Many studies relating to such hydrophilicated substrates of aluminium supports and to such hydrophilic layers formed on aluminium substrates are made these days. For example, JP-A No. 7-1853 discloses a substrate processed with an undercoating agent of polyvinylphosphonic acid; and JP-A 59-101651 discloses a technique of using a sulfonic acid group-having polymer for the undercoat layer to underlie a photosensitive layer. In addition, also proposed is a technique of using polyvinylbenzoic acid for the undercoating agent for supports.

On the other hand, flexible supports of, for example, PET (polyethylene terephthalate) or cellulose triacetate may be used in place of metal supports of aluminium, and various techniques relating to hydrophilic layers for are proposed. For example, JP-A No. 8-292558 discloses a swellable hydrophilic layer comprising a hydrophilic polymer and a hydrophobic polymer; EP 0709228 discloses a PET support having a microporous, hydrophilic crosslinked silicate surface; and JP-A Nos. 8-272087 and 8-507727 disclose a hydrophilic layer containing a hydrophilic polymer and cured with a hydrolyzed tetraalkyl orthosilicate.

These hydrophilic layers are more hydrophilic than conventional ones, and give planographic printing plates that produce good prints with no stain at the start of printing with them. However, they are problematic in that they often peel off and their hydrophilicity lowers while used repeatedly in printing. At present, therefore, it is desired to obtain planographic printing plates in which the hydrophilic layer does not peel off from the support and the hydrophilicity of the support surface does not lower even in severer printing conditions and which can therefore produce a large number of good prints with no stain. In addition, it is also desired to further increase the hydrophilicity of the support surface of planographic printing plates from the practical viewpoint in printing, and supports for planographic printing plates that are highly hydrophilic and durable to satisfy the requirements are desired.

On the other hand, recently, a method of forming images on an image-forming material directly from digitalized image data not via any medium such as lith film has been specifically noticed in the art.

Various studies relating to such printing plates for computer-to-plate systems are now made. For solving the problem of further process rationalization and waste treatment in such systems, for example, development-less planographic printing plate precursors capable of being directly set in printers not requiring development after exposure for image formation thereon are studied, and various methods for them have been proposed.

One method not requiring development comprises directly setting an exposed planographic printing plate precursor on the cylinder of a printer followed by applying dampening water and ink thereto with rotating the cylinder to thereby remove the non-image area of the printing plate precursor. This is referred to as in-printer development. According to this, a printing plate precursor is, after exposed, directly set in a printer and processed therein into a printing plate in an ordinary printing process.

The planographic printing plate precursor suitable to such in-printer development shall have a photosensitive layer soluble in dampening water or ink solvents, and it must be handlable even in light in order that it can be processed in printers put in light rooms.

For example, Japanese Patent 2,938,397 discloses a planographic printing plate precursor having, on a hydrophilic support, a thermal recording layer that contains fine particles of a thermoplastic hydrophobic polymer dispersed in a hydrophilic binder. This says that the planographic printing plate precursor disclosed accepts in-printer development. Specifically, the planographic printing plate precursor is exposed to IR laser to thereby thermally fuse the fine particles of the thermoplastic hydrophobic polymer for image formation thereon, and the thus-processed printing plate precursor is set on the cylinder of a printer and developed thereon with dampening water and/or ink applied thereto in the printer.

In the method of image formation through thermal fusion of polymer particles, the non-image region of the recoding layer enjoys good in-printer development. However, the method is problematic in that the mechanical strength of the image region of the recording layer is low and therefore the printing service durability of the printing plate is insufficient. In addition, in case where the thermal recording layer is directly formed on an aluminium substrate that is popular in planographic printing plate precursors, the heat generated in exposure is much taken by the aluminium substrate of high thermal conductivity and, as a result, the thermal energy could not be fully used for image formation, or that is, for thermal fusion of the fine polymer particles around the interface between the substrate and the thermal recording layer. If so, the image region could not be well cured, and the printing service durability of the printing plate is insufficient. This is another problem with the method.

SUMMARY OF THE INVENTION

Having investigated the problems as above, the present inventors have found that, when a layer that contains a hydrophilic polymer having a polymerizing group at the polymer ends and/or side chains is formed on a substrate having the ability to initiate polymerization or on a layer having the ability to initiate polymerization formed on a substrate and when energy is applied thereto to thereby graft the substrate or the layer on the substrate with the hydrophilic polymer, then the above-mentioned problems can be soled. On the basis of this finding, the inventors have completed the present invention.

In its first aspect, specifically, the invention provides a hydrophilic member precursor obtained by laminating a layer containing a hydrophobic polymer capable of manifesting the ability to initiate polymerization with the application of energy and an upper layer containing a hydrophilic polymer comprising a polymerizing group.

In one embodiment, the invention provides the hydrophilic member precursor, wherein a hydrophilic member is obtainable by direct binding of the polymerizing group of the hydrophilic polymer to the layer of the hydrophobic polymer by the ability to initiate polymerization manifested by energy application.

In another embodiment, the invention provides the hydrophilic member precursor, wherein the hydrophilic polymer comprises a polymerizing group at a terminal of the main chain thereof.

In still another embodiment, the invention provides the hydrophilic member precursor, wherein the hydrophilic polymer comprises a polymerizing group in a side chain thereof.

In still further embodiment, the invention provides the hydrophilic member precursor, wherein the hydrophilic polymer has a polymerizing group at a terminal of the main chain and a side chain thereof.

In yet another embodiment, the invention provides the hydrophilic member precursor, wherein the hydrophilic member is usable as a pattern forming material for forming a hydrophilic pattern through imagewise energy application.

In a further embodiment, the invention provides the hydrophilic member precursor, the layer containing the hydrophobic polymer contains a compound capable of manifesting the ability to initiate polymerization through energy application.

In a second aspect, the invention provides a support for planographic printing plates having a hydrophilic surface obtained by contacting a composition containing a hydrophilic polymer comprising a polymerizing group with a hydrophobic polymer-containing layer formed on a substrate, and applying energy whereby the hydrophilic polymer having the polymerizing group is chemically bonded directly to the hydrophobic polymer-containing layer.

In one embodiment, the invention provides the support for planographic printing plates, the hydrophobic polymer-containing layer contains a compound capable of manifesting the ability to initiate polymerization through energy application thereto.

In a third aspect, the invention provides a planographic printing plate precursor having, on a hydrophilic surface formed on a substrate, a thermal recording layer that contains a compound capable of forming a hydrophobic region by heating or exposure to radiations, the hydrophilic surface of the substrate being obtainable by contacting an interlayer formed on the substrate and containing a compound capable of manifesting the ability to initiate polymerization by heating or exposure to radiations, with a composition that contains a hydrophilic polymer having a polymerizing group and applying energy whereby the hydrophilic polymer having the polymerizing group is chemically bonded directly to the interlayer.

In one embodiment, the invention provides the planographic printing plate precursor, wherein the compound capable of forming a hydrophobic region by heating or exposure to radiations is (a) fine particles of a polymer having a thermo-reactive functional group, or (b) microcapsules enclosing a compound having a thermo-reactive functional group.

The hydrophilic member precursor of the first aspect of the invention is obtained by forming, on a desired support substrate, a layer having the ability to initiate polymerization and a layer containing a hydrophilic polymer in that order. The layers may be formed not by dipping in solution but by coating, and therefore, the precursor is easy to produce. The hydrophilic polymer in the layer to form the surface of the hydrophilic member precursor has a polymerizing group of film formability, and therefore, the surface formed of the hydrophilic polymer-containing layer is uniform and smooth.

By application of energy, the polymerization-initiating layer in the hydrophilic member precursor is activated to directly bond to the polymerizing group in the hydrophilic polymer therein, thereby forming a firmly bonding hydrophilic polymer layer of high mobility. As a result, the precursor having a hydrophilic member of high durability and hydrophilicity is obtained.

When the hydrophilic polymer in the layer has a polymerizing group not only at its ends but also in its side chains, the polymerizing group in the side chains readily bonds to the ends of the other hydrophilic polymer molecules, whereby the hydrophilic graft chains of the polymer may have a hyperbranched structure, in which every graft chain shall have a hydrophilic group. Accordingly, as compared with ordinary grafted hydrophilic polymers not having such a hyperbranched structure, the hyperbranched hydrophilic polymer may have an increased density of hydrophilic groups in a unit area, and, in addition, the mobility of each graft therein is significantly increased. As a result, further compared with ordinary hydrophilic graft polymers of high hydrophilicity, the hyperbranched hydrophilic polymer has the advantage of much more increased hydrophilicity.

The pattern forming material with the hydrophilic member of the invention has a hydrophobic polymer-containing layer formed on a desired support substrate or has a hydrophobic polymer-containing layer serving as a support, and the layer is contacted with a composition that contains a hydrophilic polymer having a polymerizing group. The hydrophilic polymer-containing composition may be contacted with the layer by dipping the layer in a solution of the composition. Apart from it, however, the layer may be coated with a hydrophilic polymer-containing composition to form a hydrophilic polymer-containing layer thereon. In the coating process, the pattern forming material is easy to produce. Another advantage of the coating process is that the hydrophilic surface formed on the hydrophilic member according to the process is uniform and smooth since the hydrophilic polymer-containing layer to form the surface of the hydrophilic member is formed of a composition that contains a hydrophilic polymer having a polymerizing group of film formability.

By application of energy, the polymerizing group in the hydrophilic polymer directly bonds to the hydrophobic polymer-containing layer in the pattern forming material to from therein a firmly bonding hydrophilic polymer layer of high mobility, and, as a result, a hydrophilic pattern of high durability and hydrophilicity is formed in the thus-processed material. In case where the hydrophobic polymer-containing layer contains a compound having the ability to initiate polymerization, reactive sites are also formed in the hydrophobic polymer-containing layer through energy application thereto. In that condition, the polymerizing group of the hydrophilic polymer in the material also bonds to the thus-formed reactive sites, and therefore more efficiently forms stronger bonds in the material.

In the region not having received energy in the material, the hydrophobic polymer-containing layer is exposed out to give a hydrophobic pattern. Accordingly, after the pattern formation in the material, a visible image-forming substance may be adhered to the hydrophilic or hydrophobic region therein, depending on its affinity for that region, and a sharp visible image is thereby easy to form in the material. According to the invention, when IR laser or the like that enables direct image formation from digital data is applied to the patter-forming material for energy application thereto, sharp images based on the digital data are easy to form in the material. In case where the hydrophilic polymer in the invention has a polymerizing group at its ends, it may bond to the hydrophobic polymer-containing layer while it has graft chains of high mobility. In that condition, therefore, the hydrophilic polymer ensures high hydrophilicity of the processed material. On the other hand, when the hydrophilic polymer has a polymerizing group not only at its ends but also in its side chains, the polymerizing group in the side chains of the polymer also bonds to the polymerizing group at the ends of the other hydrophilic polymer, and, as a result, the hydrophilic graft chains of the polymer may have a hyperbranched structure, in which every graft chain shall have a hydrophilic group. Accordingly, as compared with ordinary grafted hydrophilic polymers not having such a hyperbranched structure, the hyperbranched hydrophilic polymer may have an increased density of hydrophilic groups in a unit area, and, in addition, the mobility of each graft therein is significantly increased. As a result, further compared with ordinary hydrophilic graft polymers of high hydrophilicity, the hyperbranched hydrophilic polymer has the advantage of much more increased hydrophilicity.

The support for planographic printing plates of the second aspect of the invention has, on a desired substrate, a hydrophilic surface that contains a hydrophilic polymer compound chemically bonded directly to the surface of the substrate. Therefore, the hydrophilic surface has the advantage of high durability. In this, the hydrophilic surface is formed by contacting a hydrophobic polymer-containing layer formed on a substrate or a hydrophobic polymer-containing layer serving as a substrate with a composition that contains a hydrophilic polymer having a polymerizing group, followed by exposing to energy applied thereto to thereby chemically bond the hydrophilic polymer to the surface of the substrate. Therefore, the support does not require any specific apparatus for fabricating it, and it may have an excellent hydrophilic surface formed with ease. For contacting the two, the hydrophilic polymer-containing composition may be contacted with the layer by dipping the layer in a solution of the composition. Apart from it, however, the layer may be coated with a hydrophilic polymer-containing composition to form a hydrophilic polymer-containing layer thereon. In the coating process, the support is easy to produce. Another advantage of the coating process is that the hydrophilic surface formed on the support according to the process is uniform and smooth since the hydrophilic polymer-containing layer to form the hydrophilic surface of the support is formed of a composition that contains a hydrophilic polymer having a polymerizing group of film formability.

By application of energy, the polymerizing group in the hydrophilic polymer directly bonds to the hydrophobic polymer-containing layer that is kept in contact with the hydrophilic polymer to thereby form a firmly bonding hydrophilic polymer layer of high mobility, and, as a result, a hydrophilic surface of high durability and hydrophilicity is thereby formed on the thus-processed support. In case where the hydrophobic polymer-containing layer contains a compound having the ability to initiate polymerization, reactive sites are also formed in the hydrophobic polymer-containing layer through energy application thereto. In that condition, the polymerizing group of the hydrophilic polymer also bonds to the thus-formed reactive sites, and therefore more efficiently forms stronger bonds in the surface of the support.

The support for planographic printing plates of the type firmly bonds to its substrate and has a hydrophilic surface formed of a hydrophilic polymer layer of high mobility. Therefore, when an image-forming layer is formed on the support, it will be possible to obtain a planographic printing plate capable of giving a large number of high-quality image prints with no stain in the non-image area thereof even in any severe printing condition, irrespective of the type of the image-forming layer formed thereon.

In one preferred embodiment of the invention, the hydrophilic polymer has a polymerizing group at its ends, and therefore the hydrophilic polymer bonds to the hydrophobic polymer-containing layer to form polymer grafts of high mobility thereon. Accordingly, the hydrophilicity of the support surface is high. In addition, when the hydrophilic polymer used has a polymerizing group not only at its ends but also in its side chains, the polymerizing group in the side chains also bonds to the ends of the other hydrophilic polymer molecules, whereby the hydrophilic graft chains of the polymer may have a hyperbranched structure, in which every graft chain shall have a hydrophilic group. Accordingly, as compared with ordinary grafted hydrophilic polymers not having such a hyperbranched structure, the hyperbranched hydrophilic polymer may have an increased density of hydrophilic groups in a unit area, and, in addition, the mobility of each graft therein is significantly increased. As a result, further compared with ordinary hydrophilic graft polymers of high hydrophilicity, the hyperbranched hydrophilic polymer has the advantage of much more increased hydrophilicity.

In the planographic printing plate precursor of the third aspect of the invention, the hydrophilic surface is formed through direct chemical bonding of a hydrophilic layer to the interlayer. In this, therefore, the mobility of the hydrophilic polymer is high, and the precursor surface manifestes high hydrophilicity. Moreover, the bonding between the ends of the hydrophilic polymer to the interlayer is firm and strong and the durability of the precursor is therefore high. For these reasons, it is believed that the hydrophilic region of the non-image area of the printing plate formed from the precursor could have the function of preventing stains for a long period of time even in long-term printing service. Even when an aluminium support is used in the precursor, the interlayer to which the hydrophilic polymer has been bonded functions as a heat-insulating layer, and therefore, the heat applied to the precursor does not diffuse to the aluminium substrate and is efficiently used for image formation. Accordingly, the sensitivity of the precursor in image formation is high, and the mechanical strength of the image area formed in the processed precursor is high and the printing service durability of the printing plate from the precursor will be good.

DETAILED DESCRIPTION OF THE PREFERRED EMBODIMENTS

One layer in the hydrophilic member precursor of the first aspect of the invention, one layer in the support for planographic printing plates of the second aspect of the invention, and one layer (interlayer) in the planographic printing plate precursor of the third aspect of the invention are all characterized by containing a composition capable of manifesting the ability to initiate polymerization by energy application through exposure to heat or radiations, essentially a hydrophobic polymer. In addition to the layer therein, the hydrophilic member precursor of the first aspect of the invention and the support for planographic printing plates of the second aspect of the invention both are further characterized by having a layer of a hydrophilic polymer having a polymerizing group. Also in addition to the layer therein, the planographic printing plate precursor of the third aspect of the invention is further characterized by having a composition that contains a hydrophilic polymer having a polymerizing group.

Layer of Composition Capable of Manifesting the Ability to Initiate Polymerization Through Energy Application Thereto:

In the invention, the essential ingredient of the layer that contains a composition capable of manifesting the ability to initiate polymerization through energy application thereto is preferably a hydrophobic polymer. In one embodiment of the support for planographic printing plates of the invention, when the essential ingredient of the substrate is a hydrophobic polymer, the substrate itself may be the hydrophobic polymer-containing layer of the support. Alternatively, a hydrophobic polymer layer may be formed on a desired substrate for the support.

The hydrophobic polymer applicable to the invention includes, for example, polyethylene, polypropylene, polystyrene, cellulose diacetate, cellulose triacetate, cellulose propionate, cellulose butyrate, cellulose acetate butyrate, cellulose nitrate, polyethylene terephthalate, polycarbonate, polyvinyl acetate. These may be formed into films directly serving as the substrate for the support (also serving as the hydrophobic polymer-containing layer of the support), or, alternatively, any desired substrate may be coated with any of these polymers to give the intended hydrophobic polymer layer for the support.

In the invention, it is desirable that a compound capable of manifesting the ability to initiate polymerization through energy application thereto is added to the hydrophobic polymer layer.

In order to prepare such a hydrophobic polymer capable of manifesting the ability to initiate polymerization through energy application thereto (this is hereinafter referred to as a polymerizing hydrophobic polymer-containing layer), it is desirable that a polymerization initiator and a polymerizing compound are added to the layer.

The polymerizing hydrophobic polymer-containing layer may be prepared by dissolving the necessary ingredients in a solvent capable of dissolving them, then applying the resulting solution onto a substrate (support) in any desired method of, for example, coating the substrate with the solution, and curing the coating layer through exposure to heat or light.

Polymerizing Compound:

Not specifically limited, the polymerizing compound to be in the polymerizing layer may be any and every one which is well adhesive to the underlying substrate and which bonds to the hydrophilic polymer having a polymerizing group at least at its ends and contained in the upper layer through energy application thereto, for example, through exposure to active rays. For it, however, especially preferred is a hydrophobic polymer having a polymerizing group in the molecule.

Specifically, the hydrophobic polymer of the type includes dienic homopolymers such as polybutadiene, polyisoprene, polypentadiene; homopolymers of an allyl group-having monomer such as allyl (meth)acrylate, 2-allyloxyethyl methacrylate; binary or more polynary copolymers composed of constituent units of dienic monomers for the above-mentioned polybutadiene, polyisoprene or polypentadiene, or allyl group-containing monomers, along with any others such as styrene, (meth)acrylates and (meth)acrylonitrile; and linear polymers or ternary polymers that contain a carbon-carbon double bond in the molecule, such as unsaturated polyesters, unsaturated polyepoxides, unsaturated polyamides, unsaturated polyacrylonitriles, high-density polyethylene.

The terminology "(meth) acryl" referred to herein is meant to indicate any or both of "acryl" and "methacryl".

Polymerization Initiator:

In the invention, the polymerizing hydrophobic polymer-containing layer may contain a polymerization initiator that initiates polymerization through energy application to the layer. The polymerization initiator employable herein may be any and every one suitably selected from known thermal polymerization initiators and photopolymerization initiators having the ability to initiate polymerization through exposure to active rays, heat or electronic rays. In the invention, photopolymerization is preferred to thermal polymerization from the viewpoint of the production latitude, since the reaction speed (polymerization rate) with the former is higher that that with the latter. Therefore, photopolymerization initiators are preferred for use herein.

Not specifically limited, the photopolymerization initiator for use in the invention may be any and every one which is sensitive to active rays applied thereto and which acts to polymerize the polymerizing group-having hydrophobic polymer in the polymerizing hydrophobic polymer-containing layer with the hydrophilic polymer having a polymerizing group at its ends and contained in the hydrophilic polymer-containing layer or in the hydrophilic polymer-containing composition. For example, it includes radical polymerization initiators, anionic polymerization initiators and cationic polymerization initiators.

Specifically, examples of the photopolymerization initiators of those types are acetophenones such as p-tert-butyltrichloroacetophenone, 2,2'-diethoxyacetophenone, 2-hydroxy-2-methyl-1-phenylpropane-1-one; ketones such as benzophenones (e.g., 4,4'-bisdimethylaminobenzophenone), 2-chlorothioxanthone, 2-methylthioxanthone, 2-ethylthioxanthone, 2-isopropylthioxanthone; benzoin; benzoin ethers such as benzoin methyl ether, benzoin isopropyl ether, benzoin isobutyl ether; and benzyl ketals such as benzyldimethyl ketal, hydroxycyclohexyl phenyl ketone.

The amount of the polymerization initiator to be in the polymerizing hydrophobic polymer-containing layer preferably falls between 0.01 and 20% by weight, more preferably between 0.1 and 10% by weight in terms of its solid content of the layer.

Not also specifically limited, the solvent to be used for forming the polymerizing hydrophobic polymer-containing layer on the substrate may be any and every one capable of dissolving the essential ingredients, the hydrophobic polymer, the polymerizing group-having hydrophobic compound and the polymerization initiator. From the viewpoint of easy driability and easy workability, preferred are solvents not having a too high boiling point. Specifically those having a boiling point of from 40° C. to 150° C. or so may be selected for use herein.

Specifically, the solvents preferred for use herein are acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate.

These solvents are used either singly or in combination. The solid concentration in the coating solution is preferably from 2 to 50% by weight.

The amount of the polymerizing hydrophobic polymer-containing layer to be formed on the support preferably falls between 0.1 and 20 $g/m^2$, more preferably between 1 and 15 $g/m^2$ in terms of its dry weight. If the coating amount is smaller than 0.1 $g/m^2$, the layer could not satisfactorily manifest its ability to initiate polymerization, and if so, the hydrophobic polymer in the layer could not be well grafted with a hydrophilic polymer and the coating layer could not have a desired degree of hydrophilicity. If, however, the coating amount is larger than 20 $g/m^2$, the film property will worsen and the film will readily peel off. Anyhow, the coating amount overstepping the range is unfavorable to the invention.

As so mentioned hereinabove, the polymerizing hydrophobic polymer-containing layer is formed on the support substrate by coating the substrate with a composition for the layer, and the solvent is removed from the composition to form the layer on the substrate. In this step, it is desirable that the layer formed is cured through exposure to heat, radiations or light. In particular, it is desirable that the layer is dried under heat and then pre-cured through exposure to heat. Through the process, the hydrophobic polymer is cured in some degree, and is therefore prevented from being peeled off after it is grafted with a hydrophilic polymer. The reason why pre-curing the hydrophobic layer is preferably effected through exposure to light is the same as that mentioned hereinabove in the section of describing the photopolymerization initiators.

The heating temperature and time may be so controlled that the solvent in the coating layer is well dried up under the selected condition. From the viewpoint of production latitude, the temperature is preferably not higher than 100° C. and the drying time is not longer than 30 minutes. More preferably, the drying condition is so controlled that the drying temperature falls between 40 and 80° C. and the drying time is not longer than 10 minutes.

For exposure to light that is optionally effected after the drying under heat, employable is the light source that is used in forming the graft polymer to be mentioned below. From the viewpoint that the subsequent hydrophilic polymer layer formation is not retarded and that the formation of the bonding of the active point in the polymerizing hydrophobic polymer-containing layer to the grafting chain to be effected through energy application to the layer is not also retarded, it is desirable that the exposure to light is controlled to such a degree that the polymerizing compound in the hydrophobic polymer-containing layer may undergo partial radical polymerization but does not undergo complete radical polymerization. In general, the exposure time is not longer than 30 minutes, though depending on the intensity of the light source used. Regarding the criterion of pre-curing the layer, for example, the film retention after washing the layer with a solvent may be at least 10% and the initiator retention after pre-curing the layer may be at least 1%.

In the invention, the surface of the polymerizing hydrophobic polymer-containing layer is kept in contact with a polymerizing group-having hydrophilic polymer, and energy is applied thereto to thereby make the polymerizing group-having hydrophilic polymer chemically bond to the hydrophobic polymer. The process produces a firmly-bonding hydrophilic surface of high durability and high hydrophilicity. The bonding formation of the type is referred to as surface grafting.

For contacting them, the polymerizing hydrophobic polymer-containing layer may be dipped in a liquid composition that contains a polymerizing hydrophilic polymer. In view of the handlability of the support for planographic printing plates and of the production efficiency, preferred is a coating method which comprises coating the surface of the polymerizing hydrophobic polymer-containing layer with a layer consisting essentially of a composition that contains a polymerizing hydrophilic polymer, as so mentioned hereinunder.

Surface graft formation through energy application to the layer is described below.

In the invention, the hydrophilic surface is formed according to the surface graft polymerization method. Graft polymerization comprises applying energy to polymer compound chains through exposure to light, electron rays, heat or other radiations in an ordinary known manner to give active points, followed by further polymerizing any other polymerizing compound at the active points at which the additional polymerizing compound begins to polymerize, to thereby produce a graft polymer. In this method, when the polymer compound to give the active points is to form a surface layer, the method is referred to as surface graft polymerization. Surface grafting is meant to indicate that the polymerization-initiating polymer to form an underlying layer is grafted with the additional polymerizing compound to form a graft polymer in the surface of the layer.

In general, the surface of the hydrophobic polymer-containing layer of, for example, PET that constitutes a substrate is directly processed with plasma or electron rays to thereby give polymerization-initiating radicals in the surface of the layer, and thereafter the thus-activated surface is further reacted with a hydrophilic functional group-having monomer to form a surface layer of the resulting graft polymer. Thus formed, the surface layer is hydrophilic. In one preferred embodiment of the invention, the hydrophobic polymer-containing layer contains a polymerization-initiating compound, as so mentioned hereinabove. In that condition, the active points are readily formed in the layer even when low energy is applied to the layer, and, in addition, a large number of the active points may be formed. Through the process, a hydrophilic surface layer of higher hydrophilicity can be formed.

For graft polymerization through exposure to light may be effected in any known method. Concrete methods of optical graft polymerization are described, for example, in JP-A Nos. 63-92658, 10-296895 and 11-119413, any of which is employable in the invention. Specifically, a substrate is previously undercoated with a polymerizing composition that comprises an optical initiator and a polymerizing compound, and this is contacted with another polymerizing compound and exposed to light.

Of the methods for surface graft formation, preferred for use in the invention is optical graft formation through exposure to light for energy application to the grafting system.

The polymerizing group-having hydrophilic polymer to be in the polymerizing hydrophilic polymer-containing composition is a radical polymerizing group-having hydrophilic polymer with an ethylene addition-polymerizing unsaturated group such as a vinyl group, an allyl group or a (meth)acryl group introduced thereinto. Preferably, the polymer has the polymerizing group at least at its ends, more preferably both at its ends and in its side chains.

The radical polymerizing group-having hydrophilic polymer with an ethylene addition-polymerizing unsaturated group introduced thereinto may be produced as follows;

For producing it, for example, employable are a method of copolymerizing a hydrophilic monomer with an ethylene addition-polymerizing unsaturated group-having monomer; a method of copolymerizing a hydrophilic monomer with a double bond precursor-having monomer followed by processing the resulting copolymer with a base to thereby introduce a double bond thereinto; and a method of reacting the functional group of a hydrophilic polymer with an ethylene addition-polymerizing unsaturated group-having monomer. Especially preferred for use herein is the method of reacting the functional group of a hydrophilic polymer with an ethylene addition-polymerizing unsaturated group-having monomer.

The hydrophilic monomer to be used in producing the hydrophilic polymer that has a radical-polymerizing group at its backbone ends and/or side chains is a monomer having a hydrophilic group of, for example, carboxyl group, sulfonic acid group, phosphoric acid group, amino group or their salts, hydroxyl group, amido group or ether group. Specifically, the monomer includes, for example, (meth) acrylic acid and its alkali metal salts and amine salts, itaconic acid and its alkali metal salts and amine salts, 2-hdyroxyethyl (meth)acrylate, (meth)acrylamide, N-monomethylol(meth)acrylamide, N-dimethylol(meth) acrylamide, allylamine and its hydrohalides, 3-vinylpropionic acid and its alkali metal salts and amine salts, vinylsulfonic acid and its alkali metal salts and amine salts, 2-sulfoethyl (meth)acrylate, polyoxyethylene glycol mono (meth)acrylate, 2-crylamido-2-methylpropanesulfonic acid, acid phosphoxypolyoxyethylene glycol (meth)acrylate.

The hydrophilic polymer for use herein may be a hydrophilic homopolymer or copolymer obtainable from at least one of the above-mentioned hydrophilic monomers.

An allyl group-having monomer is copolymerizable with the hydrophilic monomer, and it includes, for example, allyl (meth)acrylate and 2-allyloxyethyl methacrylate.

One example of the double bond precursor-having monomer is 2-(3-chloro-1-oxopropoxy)ethyl methacrylate.

The addition-polymerizing unsaturated group-having monomer to be used herein for introducing an unsaturated bond to the hydrophilic polymer based on the reaction of the monomer with the functional group of, for example, carboxyl group, amino group or their salts, hydroxyl group and epoxy group in the polymer includes, for example, (meth) acrylic acid, glycidyl (meth)acrylate, allyl glycidyl ether, 2-isocyanatoethyl (meth)acrylate.

For the hydrophilic polymer having a polymerizing group at its ends or in its side chains, also employable herein are hydrophilic macromonomers. For producing the macromonomers usable herein, proposed are various methods, for example, in the Chapter 2 "Macromonomer Production" in *Macromonomer Chemistry and Industry* (edited by Yuya Yamashita, published by IPC Publishing on Sep. 20, 1989). Of such hydrophilic macromonomers, those especially useful in the invention are macromonomers derived from carboxyl group-having monomers such as acrylic acid, methacrylic acid; sulfonic acid-type macromonomers derived from monomers of 2-acrylamido-2-methylpropanesulfonic acid, vinylstyrenesulfonic acid and their salts; amide-type macromonomers derived from monomers of (meth)acrylamide, N-vinylacetamide, N-vinylformamide, N-vinylcarbonamide; macromonomers derived from hydroxyl group-having monomers such as hydroxyethyl methacrylate, hydroxyethyl acrylate, glycerol monomethacrylate; and macromonomers derived from alkoxy or ethyleneoxide group-having monomers such as methoxyethyl acrylate, methoxypolyethylene glycol acrylate, polyethylene glycol acrylate. In addition to these, polyethylene glycol chain or polypropylene glycol chain-having monomers are also usable herein for macromonomers.

Of the macromonomers mentioned above, preferred for use herein are those having a molecular weight of from250 to 100,000, more preferably from 400 to 30,000.

In forming the hydrophilic polymer-containing layer, another hydrophilic monomer may be added to the above-mentioned, polymerizing group-having hydrophilic polymer. Adding the hydrophilic monomer increases the degree of polymerization of the polymer to form the layer.

Preferably, the amount of the additional hydrophilic monomer falls between 0 and 60% by weight. If larger than 60% by weight, it is unfavorable since the coatability of the layer-forming composition is not good and the composition could not form a uniform layer.

Hydrophilic Monomer:

The hydrophilic monomer that may be combined with the hydrophilic polymer having a polymerizing group at its ends and/or its side chains includes monomers having a positive charge of ammonium or phosphonium, and monomers having a negative charge or having an acid group capable of dissociating into a negative charge, such as a sulfonic acid group, a carboxyl group, a phosphoric acid group or a phosphonic acid group. Apart from these, also preferred for use herein are hydrophilic monomers having an nonionic group such as a hydroxyl group, an amido group, a sulfonamido group, an alkoxy group or a cyano group.

Preferred examples of the hydrophilic monomer that may be combined with the hydrophilic polymer in the invention are mentioned below.

For example, they are monomers having any of a carboxyl group, a sulfonic acid group, a phosphoric acid group, an amino group or their salts, such as (meth)acrylic acid and its alkali metal salts and amine salts, itaconic acid and its alkali metal salts and amine salts, allylamine and its hydrohalides, 3-vinylproionic acid and its alkali metal salts and amine salts, vinylsulfonic acid and its alkali metal salts and amine salts, vinylstyrene-sulfonic acid and its alkali metal salts and amine salts, 2-sulfoethylene (meth)acrylate, 3-sulfopropylene (moth)acrylate and their alkali metal salts and amine salts, 2-acrylamido-2-methylpropanesulfonic acid and its alkali metal salts and amine salts, acid phosphoxypolyoxyethylene glycol mono(meth)acrylate, allylamine and their hydrohalides; and monomers having any of a carboxyl group, a sulfonic acid group, a phosphoric acid group, amino group or their salts such as 2-trimethylaminoethyl (meth) acrylate and its hydrohalides. In addition to these, also usable herein are monomers having an amino acid skeleton in the molecule such as 2-hydroxyethyl (meth)acrylate, (meth)acrylamide, N-monomethylol(meth)acrylamide, N-dimethylol(meth)acrylamide, N-vinylpyrrolidone, N-vinylacetamide, allylamine and their hydrohalides, polyoxyethylene glycol mono(meth)acrylate, N-methacryloyloxyethylcarbamic acid, aspartic acid; and monomers having a saccharide skeleton in the molecule such as glycoxyethyl methacrylate.

The solvent to be used in the composition that contains the hydrophilic polymer is not specifically limited so far as it dissolves the essential ingredients, hydrophilic macromonmers and hydrophilic monomers mentioned above. For the solvent, however, preferred are aqueous solvents such as water and water-soluble solvents. Also preferred are their mixtures optionally containing a surfactant added thereto.

The water-soluble solvent is meant to indicate a solvent that is miscible with water in any desired ratio, and it includes, for example, alcohol solvents such as methanol, ethanol, propanol, ethylene glycol, glycerin; acids such as acetic acid; ketone solvents such as acetone; and amide solvents such as formamide.

The surfactant optionally added to the solvent may be any and every one capable of dissolving in the solvent. It includes, for example, anionic surfactants such as sodium n-dodecylbenzenesulfonate; cationic surfactants such as n-dodecyltrimethylammonium chloride; and nonionic surfactants such as polyoxyethylene nonylphenyl ether (e.g., commercial product, Emulgen 910 (trade name) by Kao), polyoxyethylene sorbitan monolaurate (e.g., commercial product, Tween 20 (trade name)), polyoxyethylene lauryl ether.

In case where the composition is liquid, it may be contacted with the hydrophobic polymer-containing layer in any desired manner. For example, when the layer is coated with the liquid composition, the amount of the composition to be applied to the layer preferably falls between 0.1 and 10 $g/m^2$, more preferably between 1 and 5 $g/m^2$, in terms of the solid content of the composition. If its amount is smaller than 0.1 $g/m^2$, the composition could not form a hydrophilic surface; but if larger than 10 $g/m^2$, it could not form a uniform coating layer. Anyhow, the amount overstepping the range is unfavorable.

Energy Application:

In the invention, the mode of energy application to the hydrophilic composition-coated hydrophobic polymer layer for forming a hydrophilic surface on the layer is not specifically limited. For it, any method of energy application thereto is employable that produces active points in the surface of the polymerizing hydrophilic polymer-containing layer so that the resulting active points may bond to the polymerizing group-having hydrophilic polymer. Preferred is a method of applying active rays to the coated layer as it is inexpensive and the apparatus for it is simple.

For energy application to form the intended hydrophilic surface in the invention, the entire surface of the coated layer may be heated or it may be exposed to radiations. The preferred conditions for energy application to the entire surface of the coated layer through exposure to light or heat may be suitably selected in consideration of the matter that the polymerization-initiating compound in the polymerizing hydrophobic polymer-containing layer can manifest its ability to initiate polymerization and the initiator therein is well activated under the selected condition.

Specific methods for exposure to light or heat are described. For exposure to light, for example, employable are IR lasers, UV lamps, visible light; for exposure to electron rays, for example, employable are γ-rays; for exposure to heat for thermal energy application, for example, employable are thermal heads, heat rolls, non-contact heaters, heating zones with hot air. The light sources for these include, for example, mercury lamps, metal halide lamps, xenon lamps, chemical lamps, carbon arc lamps. The radiations include, for example, electron rays, X-rays, ion beams and far-IR rays. In addition, also employable are g-rays, i-rays, deep-UV rays, high-density energy beans (laser beams).

The laser for laser exposure may be any of gaseous lasers such as carbon dioxide laser, nitrogen laser, Ar laser. He/Ne laser, He/Cd laser, Kr laser; liquid (color) lasers; solid lasers such as ruby laser, Nd/YAG laser; semiconductor lasers such as GaAs/GaAlAs laser, InGaAs laser; and excimer lasers such as KrF laser, XeCl laser, XeF laser, $Ar_2$. Above all, preferred is exposure to high-power solid IR laser such as 700–1200 nm IR semiconductor laser or YAG laser.

Specific embodiments preferred for exposure of the entire surface of the coated layer to heat or light include, for example, direct or indirect entire surface heating with a heating unit; scanning exposure to IR lasers; high-intensity flash exposure to xenon arc lamps; and exposure to IR lamps.

For exposure to active rays, preferred are UV rays and visible light. More preferred are UV rays as enabling rapid polymerization. Preferably, the essential wavelength of the active rays falls between 250 nm and 800 nm.

The light source for UV exposure includes, for example, low-pressure mercury lamps, high-pressure mercury lamps, fluorescent lamps, xenon lamps, carbon arc lamps, tungsten incandescent lamps, sunlight.

The necessary time for exposure to light varies, depending on the intended degree of hydrophilicity to be obtained and on the light source used. Generally, it falls between a few seconds and 24 hours.

Through energy application to the entire surface of the coated substrate, the active points formed in the hydrophobic polymer-containing layer polymerize with the polymerizing group-having hydrophilic polymer to form a hydrophilic surface having hydrophilic graft chains of high mobility. In one preferred embodiment in which the hydrophilic polymer-containing composition further contains a hydrophilic polymer having a polymerizing group in its side chains, the hydrophilic graft chains may further bond to the polymerizing group in the grafted side chains of the hydrophilic polymer having bonded to the hydrophobic polymer-containing layer to thereby form additional graft chains having a branched structure. As a result, the density and also the mobility of the thus-formed hydrophilic grafts of high mobility are much more increased, and the hydrophilicity of the hydrophilic surface formed greatly increases.

In case where the hydrophilic member to be obtained from the hydrophilic member precursor of the first aspect of the invention is sued for a pattern forming material, its region having received energy applied thereto forms a hydrophilic pattern of the hydrophilic grafts formed therein while in the other region of the surface of the hydrophobic polymer-containing layer not having received energy is still kept hydrophobic.

To the hydrophilic/hydrophobic pattern thus formed, organic or inorganic molecules capable of forming visible images are adhered, and they form a visible image in the thus-processed material.

The organic or inorganic molecules to be adhered to the hydrophilic/hydrophobic pattern may be any ones capable of forming visible images, and they may be low-molecular compounds or high-molecular compounds.

The substances capable of forming visible images are those that absorb visible light. Specifically, for example, they include color dyes and pigments, various pigments not transmitting light, and metal particles.

Relationship Between Polar Group in Surface Graft Polymerization and Organic or Inorganic Molecules:

Specifically, when the hydrophilic group in the hydrophilic polymer in the patterned material has a negative charge of, for example, a sulfonate group or a carboxylate group, positively-charged molecules of, for example, cationic dyes are adhered to the hydrophilic/hydrophobic pattern to form a visible image in the material.

The cationic organic or inorganic molecules to be used for image formation include, for example, cationic dyes, cationic-charged inorganic pigments, metal particles, pigments coated with a cationic surface layer, and coated metal particles.

The cationic dyes for use herein may be selected from any known dyes in accordance with the object in their use including the intended color tone and image density. It is considered that the cationic dyes are electrically attracted by the surface of the image-recording layer of the pattern forming material owing to the function of the acid group (e.g., sulfonic acid group, carboxylic acid group) that serves as a polarity-converting group in the surface of the layer, therefore not only remaining in the surface of the layer but also penetrating into the inside of the layer to finally bond to the acid group in the layer to form an image. Accordingly, the image is formed through the ionic interaction and therefore firmly bonds to the material. Even when a small amount of the dye is used, it gives a high-density image of good fastness.

The cationic dyes include, for example, those having an alkylamino or aralkylamino bond at the end of the chromophoric group thereof; those having an acid amido bond such as a sulfoalkylamido bond; azo dyes and methine dyes having a group capable of forming a cation; and heterocyclic compounds such as thiazole-azo dyes. The skeleton of the cationic dyes includes, for example, triphenylmethane, diphenylmethane, xanthene, acridine, azine, thiazine, thiazole, oxazine, and azo. The dyes of those types are described in detail, for example, on pp. 316–322 of *New Dye Chemistry* (written by Yutaka Hosoda, published by Gihodo, 1957).

In another image-forming mechanism applicable to the invention in which, for example, the hydrophilic group of the hydrophilic polymer has a cationic charge such as an ammonium group, the hydrophilic polymer adsorbs negative-charged molecules of, for example, acid dye to form visible images.

The anionic organic or inorganic molecules for image formation of that type include acid dyes, anionic-charged inorganic pigments, metal particles, pigments having an anionic surface layer, and coated metal particles.

The acid dyes for use in the case may be selected from any known dyes in accordance with the object in their use including the intended color tone and image density. The acid dyes include, for example, azo dyes, anthraquinone dyes, triphenylmethane dyes, xanthene dyes, azine dyes, and quinoline dyes, any of which are usable herein in any desired manner. Concrete examples of the dyes are C.I. Acid Yellow 1, C.I. Acid Orange 33, C.I. Acid Red 80, C.I. Acid Violet 7, C.I. Acid Yblue 93. The dyes are described in detail, for example, on pp. 392–471 of *Dye Handbook* (edited by the Organic Synthetic Chemistry Association, published by Maruzen, 1970).

Not only one but also, if desired, two or more different types of the organic or inorganic molecules may be used either singly or in combination for image formation. For obtaining images of desired color tone, multiple colorant materials may be premixed.

For making the hydrophilic/hydrophobic region of the pattern forming material adsorb such organic or inorganic molecules for image formation therein, employable are a method of applying a solution or dispersion of organic or inorganic molecules to the surface of the pattern forming material that has been imagewise exposed to form patterns thereon; and a method of dipping the imagewise patterned material in the solution or dispersion. In any method of coating the patterned material with the solution or dispersion or dipping it in the solution or dispersion, it is desirable that excess organic or inorganic molecules are applied to the material so that the desired hydrophilic/hydrophobic pattern region of the material may fully adsorb the molecules. The time for contacting the surface of the patterned material with the solution or dispersion preferably falls between 10 seconds and 60 minutes or so, more preferably between 1 and 20 minutes or so.

It is preferable that the patterned region of the material adsorbs the largest amount of organic or inorganic molecules applied thereto for higher sharpness, better color tone and better durability of the images formed. In view of the adsorption efficiency to form good images, the concentration of the solution or dispersion preferably falls at least between 10 and 20% by weight or so.

The amount of the organic or inorganic molecules to be used for image formation may be suitably determined, depending on the image formation mechanism employed and on the object of image formation. In case where the patterned material adsorbs the molecules in a mode of ionic adsorption, it may form thereon an image of higher density and higher sharpness even when the amount of the molecules used is smaller than that of a color-forming material or a colorant material to be used in ordinary image formation.

In case where a resin film of a hydrophobic polymer-containing layer that serves also as a support is used and when its patterned region adsorbs a light-impervious material such as inorganic pigment or metal pigment or when the region adsorbs light-transmissive color dye, it is easy to produce light-transmissive patterned materials or display materials such as those for OHP or for electric decorations to be on the street.

Still another image-forming mechanism applicable to the invention comprises adhering a hydrophobic material such an oily ink to the hydrophobic region of the patterned material. In image-forming mechanism of the type, only the non-exposed hydrophobic region of the patterned material adsorbs organic or inorganic molecules. Therefore, this mechanism is suitable to monochromatic image formation.

Application to Planographic Printing Plate Precursor:

According to the image-forming method mentioned above, the pattern forming material of the invention is usable for planographic printing plate precursors. Specifically, when dampening water and oily ink are applied to the patterned material, the hydrophilic pattern region of the material adsorbs the dampening water to form a non-image region while the surface of the hydrophobic polymer-containing layer thereof receives the oily ink to form an image region. In this, since the hydrophilic pattern region has a hydrophilic graft structure, its hydrophilicity is high. Therefore, in this, the non-image region from the hydrophilic pattern region is not stained, and the material forms images of high quality.

When the pattern forming material of the invention is so designed that an upper layer of a composition that contains a polymerizing group-having hydrophilic polymer is formed on the hydrophobic polymer-containing layer, the upper layer is readily removed and the underlying hydrophobic polymer-containing layer is thereby exposed out in the initial stage of printing operation that starts with application of ink and dampening water thereto. Accordingly, the pattern forming material is favorable for planographic printing plate precursors that undergo in-printer development.

Support Substrate:

As so mentioned hereinabove, the support substrate for use in the invention may be a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and the hydrophobic polymer-containing layer of the plastic film may serve also as a support. If desired, however, the hydrophobic polymer-containing layer may be formed on any other desired substrate to be a support. The support (substrate) for use in the invention is preferably a sheet material of good dimensional stability. It includes, for example, paper, paper laminated with a plastic (e.g., polyethylene, polypropylene, polystyrene), metal sheets (e.g., aluminium, zinc, copper), and paper or plastic films laminated or deposited with such a metal. Above all, especially preferred for use herein are polyester films that serve also as the hydrophobic polymer-containing layer, and aluminium sheets of good dimensional stability.

Planographic Printing Plate Precursor:

The planographic printing plate precursor of the invention may be fabricated by forming a thermal recording layer (image-forming layer) on the support that has a hydrophilic surface formed in the manner as above. The material to form the image-forming layer is not specifically limited. Any and every type of image-forming layer may be formed on the support, since the hydrophilic surface of the support of high hydrophilicity and good durability may form a non-image region. Thus fabricated, the planographic printing plate precursor of the invention may be processed into a planographic printing plate capable of giving a large number of images of good quality with no stain in the non-image region thereof.

Image-forming Layer:

The image-forming layer applicable to the support for planographic printing plates of the invention is not specifically limited. For example, it may be any of positive or negative photosensitive image-forming layers known in the field of conventional PS plates and photoresists.

The image-forming layer (photosensitive recording layer or thermal recording layer) to be formed on the hydrophilic surface of the support in the invention contains a composition sensitive to positive reaction or a composition sensitive to negative reaction.

Composition Sensitive to Positive Reaction:

Preferred examples of the composition sensitive to positive reaction for use in the invention are the following conventional positive photosensitive compositions (a) to (d) all known in the art.

(a) Conventional positive photosensitive compositions heretofore used in the art, which contain naphthoquinonediazide and novolak resin.

(b) Laser-sensitive positive compositions which contain a water-insoluble but alkali-soluble polymer compound and a photo-thermal converting agent and of which the solubility in an aqueous alkaline solution increases after exposure to light or heat.

(c) Laser-sensitive positive compositions which contain a thermal-degradable sulfonate polymer or an acid-degradable carboxylate polymer and an IR absorbent.

(d) Chemically-amplified, photosensitive positive compositions which contain an acid-degradable group-protected, alkali-soluble compound and an acid generator.

The compounds to be in the photosensitive positive compositions (a) to (d) are described below.

(a) For the quinonediazide compounds favorable for the conventional photosensitive positive compositions heretofore used in the art that contain naphthoquinonediazide and novolak resin, mentioned are o-quinonediazide compounds.

O-quinonediazide compounds usable in the invention have at least one o-quinonediazido group in one molecule, and, when thermally degraded, they promote the solubility of alkali-soluble polymers in alkali. Various types of o-quinonediazide compounds are known, and any of which are usable herein. O-quinonediazides have two effects. One is that, when they are thermally degraded, they lose their ability to retard dissolution of alkali-soluble compounds; and the other is that, when they are thermally degraded, they themselves change into alkali-soluble substances. Based on these effects, o-quinonediazides assist the dissolution of photographic materials. Some typical examples of o-quinonediazide compounds usable in the invention are described, for example, in J. Kosar's *Lightsensitive Systems* (by John Wiley & Sons, Inc.), pp. 339–352.

Preferably, the amount of the o-quinonediazide compound to be added to the image-forming layer in the invention is from 1 to 50% by weight, more preferably from 5 to 30% by weight, even more preferably from 10 to 30% by weight of the total solid content of the layer. One or more these compounds may be used herein either singly or in combination.

Next described are the novolak resin to be in the compositions (a), and the water-insoluble but alkali-soluble compound to be in the laser-sensitive positive compositions (b) which contain a water-insoluble but alkali-soluble polymer compound and a photo-thermal converting agent and of which the solubility in an aqueous alkaline solution increases after exposure to light or heat.

The water-insoluble but alkali-soluble polymer compound which is the essential ingredient of the image-forming layer in the invention is a polymer compound having an acid structure mentioned below in its backbone chain or side chains.

The acid structure is any of a phenolic hydroxyl group (—Ar—OH), a carboxylic acid group ($—CO_2H$), a sulfonic acid group ($—SO_3H$), a phosphoric acid group ($—OPO_3H$), a sulfonamido group ($—SO_2NH—R$), and a substituted sulfonamidic acid group (active imido group) ($—SO_2NHCOR$, —SO2NHSO$_2$R, $—CONHSO_2R$).

In these, Ar represents an optionally-substituted divalent aryl group; and R represents an optionally-substituted hydrocarbon group.

Of these acid groups, especially preferred are a phenolic hydroxyl group, a sulfonamido group, and an active imido group; and most preferred are alkali-soluble resins having a phenolic hydroxyl group.

For the phenolic hydroxyl group-having polymer compounds for use herein, also preferred are novolak resins such as p-cresol and formaldehyde polycondensates, m-/p-mixed cresol and formaldehyde polycondensates, and phenol, cresol (m-, p-, or mixed m-/p-) and formaldehyde polycondensates.

These polymer compounds are described in detail in the applicant's own prior patent application, JP-A No. 2001-56548, paragraphs [0063] to [0088], and the description therein shall apply also to the invention.

The novolak resins usable in the image-forming layer in the invention are those obtained through condensation of phenols and aldehydes under acidic conditions. Preferred novolak resins for use herein are, for example, those obtained from phenol and formaldehyde; those obtained from m-cresol and formaldehyde; those obtained from p-cresol and formaldehyde; those obtained from o-cresol and formaldehyde; those obtained from octylphenol and formaldehyde; those obtained from m-/p-mixed cresol and formaldehyde; and those obtained from a mixture of phenol/cresol (any of o-, m- or p-cresol, or m-/p-, m-/o- or o-/m-mixed cresol) and formaldehyde. Preferably, the novolak resins have a weight-average molecular weight of from 800 to 200,000 and a number-average molecular weight of from 400 to 60,000.

The amount of the novolak resin-containing, alkali-soluble compound to be in the image-forming layer may be from 10 to 90% by weight, preferably from 20 to 85% by weight, more preferably from 30 to 80% by weight of the total solid content of the layer. If the amount of the alkali-soluble compound in the layer is smaller than 10% by weight, it is unfavorable since the durability of the layer is not good; and if larger than 90% by weight, it is also unfavorable since both the sensitivity and the durability of the layer are not good.

One or more such alkali-soluble compounds may be used in the invention either singly or in combination.

The photo-thermal converting substance to be in the image-forming layer of (b) is described.

In case where the planographic printing plate precursor is processed with IR laser or the like for image formation thereon, it is desirable that the precursor contains a photo-thermal converting substance having the ability to convert optical energy to heat energy. The precursor may contain the photo-thermal converting substance somewhere therein, not limited to its image-forming layer, so far as the substance therein exhibits the same effect anywhere in the precursor. For example, the precursor may contain the photo-thermal converting substance in any of the hydrophilic surface of the support, or the image-forming layer, or even in an additional layer provided between the hydrophilic surface of the support and the image-forming layer.

The photo-thermal converting substance that may be in the planographic printing plate precursor of the invention is not specifically limited, and maybe any and every substance capable of absorbing light such as UV light, visible light, IR light and white light to convert it into heat. For example, it includes carbon black, carbon graphite, pigment such as phthalocyanine pigment, iron powder, graphite powder, iron oxide powder, lead oxide, silver oxide, chromium oxide, iron sulfide, and chromium sulfide. Especially preferred are dyes, pigments and metals capable of effectively absorbing IR light falling between 760 nm and 1200 nm.

The dyes are described in the applicant's own prior patent application JP-A No. 2001-42540, paragraphs [0138] to [0142]; and the pigments are described in the same patent application, paragraphs [0160] to [0163].

The amount of the dye or pigment to be in the photo-thermal converting substance-containing layer may be from 0.01 to 50% by weight, preferably from 0.1 to 10% by weight of the total solid content of the layer. More preferably, the amount of the dye is from 0.5 to 10% by weight; and that of the pigment is from 0.1 to 10% by weight. If the amount of the pigment or dye is smaller than 0.01% by weight, the layer will be ineffective for increasing the sensitivity of the precursor; but if larger than 50% by weight, the film strength of the photo-thermal converting substance-containing layer will be low.

The laser-sensitive positive composition (c) contains a thermal-degradable sulfonate polymer or an acid-degradable carboxylate polymer and an IR absorbent. For the thermal-degradable sulfonate polymer and the acid-degradable carboxylate polymer that may be in the composition, for example, usable are sulfonate polymers and carboxylate polymers described in JP-A No. 10-282672, European Patent (EP) 652483, and PCT National Publication (JP-A) No. 6-502260. Concrete examples of the polymers are secondary sulfonate polymers such as polycyclohexyl styrenesulfonate, polyisopropyl styrenesultonate, poly-1-methoxy-2-propyl styrenesulfonate; and acid-degradable group-protected acrylates such as poly-t-butyl methacrylate, polytetrahydropyranyl methacrylate.

For the IR absorbent to be in the composition, usable are the compounds which have been mentioned hereinabove for the photo-thermal converting substance and which have the ability to absorb IR rays.

The chemically-amplified photosensitive positive composition (d) contains an acid-degradable group-protected alkali-soluble compound and an acid generator. In this, the acid-degradable group-protected alkali-soluble compound is a compound which becomes soluble in alkali when degraded by acid. The acid-degradable group in the compound may be a well known protective group such as t-butyl esters, t-butyl carbamates, alkoxyethyl esters.

The acid generator is a compound capable of generating an acid when exposed to heat or light. In general, it includes photoinitiators for photocationic polymerization, photoinitiators for photoradical polymerization, optical discoloring or decoloring agents for dyes, known compounds capable of generating acids through exposure to light as in microresists; and their mixtures. Any of these may be suitably selected and used in the composition. Concrete examples of the acid generator are onium salts such as diazonium salts, halides, and sulfonates.

The amount of the acid generator to be added to the image-forming layer may fall generally between 0.001 and 40% by weight or so, preferably between 0.01 and 20% by weight, more preferably between 0.1 and 5% by weight of the total solid content of the layer.

Negative-sensitive Composition:

The negative-sensitive composition for use in the invention may be any of known conventional negative-sensitive composition (e) to (h) mentioned below.

(e) Negative-sensitive compositions containing a photo-crosslinking group-having polymer and an azide compound.

(f) Negative-sensitive compositions containing a diazo compound.

(g) Photopolymerizing or thermal-polymerizing negative-sensitive compositions that contain a photopolymerization or thermal polymerization initiator, an addition-polymerizing unsaturated compound, and an alkali-soluble polymer-compound.

(h) Negative-sensitive compositions containing an alkali-soluble polymer compound, an acid generator, and an acid-crosslinking compound.

The compounds to be in the negative-sensitive compositions (e) to (h) are described below.

The negative-sensitive composition (e) contain a photo-crosslinking group-having polymer and an azide compound. In this, the photocrosslinking group-having polymer preferably has an affinity for an aqueous alkaline developer. For example, it includes a polymer having a photocrosslinking group such as —CH═CH—CO— in the backbone chain or the side chains of the molecule, as in U.S. Pat. No. 5,064,747; a copolymer having both a cinnamyl group and a carboxyl group as in Japanese Patent Application Publication (JP-B) No. 54-15711: a polyester resin having both a phenylenediacrylic residue and a carboxyl group as in JP-A No. 60-165646; a polyester resin having both a phenylenediacrylic residue and a phenolic hydroxyl group as in JP-A No. 60-203630; a polyester resin having both a phenylenediacrylic residue and a sodium iminodisulfonyl group as in JP-B No.57-42858; and a polymer having both an azido group and a carboxyl group in the side chains as in JP-A No. 59-208552. In the invention, the amount of the photo-crosslinking group-having polymer to be in the image-forming layer may fall between 5 and 100% by weight or so, preferably between 10 and 95% by weight, more preferably between 20 and 90% by weight of the total solid content of the layer.

The azide compound to be in the composition (e) includes, for example, 2,6-bis(4-azidobenzal)-4-methylcy-clphexanone, and 4,4'-diazidophenyl sulfide.

The amount of the azide compound to be in the image-forming layer in the invention may fall between 5 and 95% by weight or so, preferably between 10 and 90% by weight, more preferably between 20 and 80% by weight of the total solid content of the layer.

The negative-sensitive composition (f) contains a diazo compound. In this, the diazo compound is, for example, a diazo resin typically such as a salt of a condensate of a diazodiarylamine and an active carbonyl compound. Preferably, the diazo compound is sensitive to light, insoluble in water and soluble in organic solvent.

Preferred examples of the diazo resin are organic acid salts or inorganic acid salts of condensates of 4 -diazodiphenylamine, 4-diazo-3-methyldiphenylamine, 4-diazo-4'-methyldiphenylamine, 4-diazo-3'-mthyldiphenylamine, 4-diazo-4'-methoxydiphenylamine, 4-diazo-3-methyl-4'-ethoxydiphenylamine or 4-diazo-3-methoxydiphenylamine with formaldehyde, paraformaldehyde, acetaldehyde, benzaldehyde or 4,4'-bis-methoxymethyldiphenyl ether. The organic acids for the salts include, for example, methanesulfonic acid, benzenesulfonic-acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, 2-hydroxy-4-methoxybenzophenone-5-sulfonic acid; and the inorganic acids for the salts include, for example, hexafluorophosphoric acid, tetrafluorophosphoric acid, thiocyanic acid.

In the invention, the amount of the diazo resin to be in the image-forming layer preferably falls between 0 and 40% by weight or so of the total solid content of the layer. If desired, two or more different types of diazo resins may be combined for use herein.

The photopolymerizing or thermal-polymerizing negative-sensitive composition (g) contains a photopolymerization or thermal polymerization initiator, an addition-polymerizing unsaturated compound, and an alkali-soluble polymer compound. In this, the photopolymerization or thermal polymerization initiator, and the addition-polymerizing unsaturated compound are, for example, addition-polymerizable ethylenic double bond-having compounds. The compounds have at least one, but preferably at least two terminal ethylenic unsaturated bonds in the molecule, and any of these compounds may be selected and used in the composition.

The compounds may have any chemical morphology including, for example, monomers, prepolymers (dimers, trimers and other oligomers), their mixtures, and low-molecular copolymers that comprises such unsaturated bond-having structural units.

Examples of the monomers and their copolymers are esters of unsaturated carboxylic acids (e.g., acrylic acid, methacrylic acid, itaconic acid, crotonic acid, isocrotonic acid, maleic acid) with aliphatic polyalcohol compounds; and amides of unsaturated carboxylic acids with aliphatic polyamine compounds.

For the addition-polymerizing unsaturated compound and the photopolymerization initiator to be in the negative-sensitive composition, mentioned are addition-polymerizing unsaturated compounds and photopolymerization initiators having at least two terminal ethylene groups such as those described in U.S. Pat. Nos. 2,760,863 and 3,060,023, and JP-A No. 62-121448.

The amount of the addition-polymerizing unsaturated compound to be in the composition may fall between 5 and 95% by weight or so, preferably between 5 and 80% by weight.

For the photopolymerization (thermal polymerization) initiator to be in the image-forming layer of the invention, usable are various types of photopolymerization (thermal polymerization) initiators known in patent publications or other literature, depending on the wavelength of the light to be applied to the layer. If desired, two or more different types of such initiators may be combined to be a combined initiator system for use herein.

For light sources of visible light of not shorter than 400 nm, Ar laser, semiconductor laser secondary harmonics and SHG-YAG laser, various types of optical initiator systems usable herein are proposed. For example, they are photoreductive dyes as in U.S. Pat. No. 2,850,445; as well as combined systems of dye and initiator, such as a combined system of organic peroxide and dye (as in JP-A Nos. 59-1504, 59-140203, 59-189340, 62-174203, 62-1641, and U.S. Pat. No. 4,766,055), a combined system of dye and active halogen compound (as in JP-A Nos. 63-258903, 2-63054), and a combined system of dye and borate compound (as in JP-A Nos. 62-143044, 62-150242, 64-13140, 64-13141, 64-13142, 64-13143, 64-13144, 64-17048, 1-229003, 1-298348, 1-138204).

In case where an IR laser is used for the light source for exposure, a combination of a photo-thermal converting agent and a radical generator is used for the initiator. For the radical generator to be in the combination, preferred are onium salts specifically including iodonium salts, diazonium salts and sulfonium salts. The initiator of the type is described in detail in the applicant's own prior patent application JP-A No. 2000-132478, paragraphs [0034] to [0040]. and the description therein shall apply also to the invention.

The amount of the photopolymerization initiator to be in the image-forming layer may fall between 1 and 80% by weight or so, preferably between 5 and 50% by weight of the total solid content of the layer.

The negative-sensitive composition (h) contains an alkali-soluble polymer compound, an acid generator, and an acid-crosslinking compound. In this, the acid-crosslinking compound is meant to indicate a compound capable of crosslinking in the presence of an acid, and it includes, for example, aromatic compounds and heterocyclic compounds that are poly-substituted with any of a hydroxymethyl group, an acetoxymethyl group and an alkoxymethyl group. Of those, preferred for use herein are compounds prepared through condensation of phenols with aldehydes under basic condition.

The embodiment as above is described in the applicant's own prior patent application JP-A No. 2001-42540, paragraphs [0009] to [0012]. Preferred examples of the acid-crosslinking compound are described in detail in the same patent application, paragraphs [0015] to [0086] as a crosslinking agent for use therein, and these apply also to the invention.

Preferably, the acid-crosslinking compounds for use in the invention have a weight-average molecular weight of from 500 to 100,000 and a number-average molecular weight of from 200 to 50,000.

The photo-thermal converting agent to be in the composition (h) may be the same as the photo-thermal converting substance to be in the positive-sensitive compositions mentioned hereinabove; and the acid generator to be in the composition (h) may also be the same as that to be in the positive-sensitive compositions mentioned hereinabove.

The alkali-soluble polymer compound to be in the composition (h) may be the same as the alkali-soluble polymer compound to be in the positive-sensitive compositions mentioned hereinabove. In addition to it, other polymer compounds mentioned below are usable in the composition (h).

The polymer compounds are addition polymers having a carboxylic acid group in their side chains such as those described in JP-A No. 59-44615, JP-B Nos. 54-34327, 58-12577, 54-25957. JP-A Nos. 54-92723, 59-53836, 59-71048. For example, they are methacrylic acid copolymers, acrylic acid copolymers, itaconic acid copolymers, crotonic acid copolymers, maleic acid copolymers, and partially esterified maleic acid copolymers. Also usable are acidic cellulose derivatives having a carboxylic acid in their side chains. In addition to these, further usable are adducts prepared by adding cyclic acid anhydrides to hydroxyl group-having addition polymers.

Having a radical-reactive group introduced into their side chains, these polymers increase the mechanical strength of cured films. The addition-polymerizing functional group includes, for example, ethylenic unsaturated bond groups, amino groups and epoxy groups; the functional group capable of forming a radical through exposure to light includes, for example, mercapto groups, thiol groups, halogen atoms, triazine structures and onium salt structures; and the polar group includes, for example, carboxyl groups and imido groups. For the addition-polymerizing functional group, preferred are ethylenic unsaturated bond groups such as acrylic, methacrylic, allyl and styryl group. For it, in addition, also usable is a functional group selected from amino groups, hydroxyl groups, phosphonic acid groups, phosphoric acid groups, carbamoyl groups, isocyanate groups, ureido groups, ureylene groups, sulfonic acid groups and ammonio groups.

For ensuring the developability of the image-forming layer, the polymers for use in the layer formation in the invention preferably have a suitable molecular weight and a suitable acid value. In general, the polymers preferred for the layer formation have a weight-average molecular weight of from 5000 to 300,000 and an acid value of from 0.2 to 5.0 meq/g.

The amount of the organic polymer to be in the layer-forming composition is not specifically limited and may be determined in any desired manner. However, if the amount oversteps 90% by weight, it is unfavorable since the mechanical strength of the image to be formed in the layer will be low. Preferably, therefore, the amount falls between 10 and 90%, more preferably between 30 and 80%. In the layer-forming composition, the ratio by weight of the photopolymerizing ethylenic unsaturated compound to the organic polymer preferably falls between 1/9 and 9/1, more preferably between 2/8 and 8/2, even more preferably between 3/7 and 7/3.

The thermal recording layer to be in the planographic printing plate precursor of the third aspect of the invention preferably contains (a) fine particles of a polymer having a thermo-reactive functional group, or (b) microcapsules of a compound having a thermo-reactive functional group. Having the thermal recording layer of the type, the planographic printing plate precursor has good in-printer developability and may form images thereon through exposure to IR radiations.

The thermo-reactive functional group common to the above (a) and (b) includes, for example, polymerizing ethylenic unsaturated groups (e.g., acryloyl group, methacryloyl group, vinyl group, allyl group); isocyanate groups that accept addition reaction, and their blocked groups, as well as their reaction partners, active hydrogen atom-having functional groups (e.g., amino group, hydroxyl group, carboxyl group); epoxy groups that accept addition reaction, and their reaction partners, amino group, carboxyl group or hydroxyl group; carboxyl groups that accept condensation with hydroxyl or amino group, and their reaction partners; acid anhydrides that accept ring-cleaving addition reaction with amino or hydroxyl group, and their reaction partners. However, the thermo-reactive functional group for use in the invention is not limited to the above, and any and every functional group is acceptable herein so far as it forms some chemical bond through chemical reaction.

First described are the polymer particles (a) having a thermo-reactive functional group.

The thermo-reactive functional group favorable for the polymer particles (a) includes, for example, an acryloyl group, a methacryloyl group, a vinyl group, an allyl group, an epoxy group, an amino group, a hydroxyl group, a carboxyl group, an isocyanate group, an acid anhydride group, and their protected groups. Introducing the thermo-reactive functional group into the polymer particles may be effected during polymerization to form the polymer particles, or after polymerization through additional polymer reaction.

In case where the thermo-reactive functional group is introduced into the polymer particles during polymerization, it is desirable that a thermo-reactive functional group-having monomer is polymerized in a mode of emulsion polymerization or suspension polymerization.

Examples of the thermo-reactive functional group-having monomer are allyl methacrylate, allyl acrylate, vinyl methacrylate, vinyl acrylate, glycidyl methacrylate, glycidyl acrylate, 2-isocyanatoethyl methacrylate and its blocked isocyanates with alcohols, 2-isocyanatoethyl acrylate and its blocked isocyanates with alcohols, 2-aminoethyl methacrylate, 2-aminoethyl acrylate, 2-hydroxyethyl methacrylate, 2-hdyroxyethyl acrylate, acrylic acid, methacrylic acid, maleic anhydride, difunctional acrylates and difunctional methacrylates. However, the thermo-reactive functional group-having monomers usable in the invention are not limited to these.

In producing the thermo-reactive functional group-having polymers, the thermo-reactive functional group-having monomers may be copolymerized with any other comonomers not having the functional group. The comonomers not having the functional group include, for example, styrene, alkyl acrylates, alkyl methacrylates, acrylonitrile, and vinyl acetate, but these are not limitative. Any others not having such a thermo-reactive functional group may serve as the comonomers.

The polymer reaction for introducing the thermo-reactive functional group into the polymers after polymerization is described, for example, in the pamphlet of International Patent Laid-Open Publication No. 96/34316.

Of the polymer particles (a) having a thermo-reactive functional group, preferred are those that readily fuse and aggregate under heat in view of the image formability of the planographic printing plate precursor containing them. More preferred are those having a hydrophilic surface and capable of dispersing in water in view of the in-printer developability of the precursor. When the precursor is fabricated by applying thereto only the polymer particles followed by drying them at a temperature lower than the solidifying point of the particles, it is desirable that the contact angle of water drops in air to the polymer film formed in that condition is smaller than that to the polymer film formed by drying it at a temperature higher than the solidifying point of the polymer particles.

For making the particulate polymer film have the preferred surface hydrophilicity, the particulate polymer film formed shall adhere a hydrophilic polymer or oligomer or a hydrophilic low-molecular compound applied thereto, but the method of hydrophilicating the surface of the particulate polymer film is not limited to it, and any other various known methods of surface hydrophilication are employable herein.

Preferably, the thermo-fusing temperature of the thermo-reactive functional group-having polymer particles (a) is not lower than 70° C., more preferably not lower than 80° C. in view of the storage stability of the planographic printing plate precursor that contains the polymer particles. However, if the thermo-fusing temperature of the polymer particles is too high, it is unfavorable from the viewpoint of the sensitivity of the precursor. Therefore, the thermo-fusing temperature of the polymer particles preferably falls between 80 and 250° C., more preferably between 100 and 150° C.

Also preferably, the mean particle size of the polymer particles (a) is from 0.01 to 20 μm, more preferably from 0.05 to 2.0 μm, even more preferably from 0.1 to 1.0 μm. Within the range, the polymer particles ensure good image resolution and storage stability of the image-forming layer containing them.

Also preferably, the amount of the polymer particles (a) is from 50 to 98% by weight , more preferably from 60 to 95% by weight of the solid content of thermal recording layer.

Next described are the microcapsules with a thermo-reactive functional group(b)-having compound encapsulated therein.

For the thermo-reactive functional group in the compound to be encapsulated into microcapsules (b), referred to are those mentioned hereinabove for the functional group common to (a) and (b). In addition to these, the group further includes, for example, polymerizing unsaturated groups, hydroxyl groups, carboxyl groups, carboxylate groups, acid anhydride groups, amino groups, epoxy groups, isocyanate groups, and blocked isocyanate groups.

The polymerizing unsaturated group-having compounds are preferably those having at least one, more preferably at least two ethylenic unsaturated bonds such as acryloyl, methacryloyl, vinyl and allyl groups. The compound group is well known in this industrial field. With no specific limitation thereon, any and every compound of the type is employable in the invention. For its chemical morphology, the compound includes monomers, prepolymers, e.g., dimers, trimers and oligomers, and their mixtures and copolymers.

Specifically, the compound includes unsaturated carboxylic acids (e.g., acrylic acid, methacrylic acid, itaconic acid, crotonic acid, isocrotonic acid, maleic acid), their esters, and unsaturated carboxamides. Above all, preferred for use herein are esters of unsaturated carboxylic acids with aliphatic polyalcohols, and amides of unsaturated carboxylic acids with aliphatic polyamines.

Also preferred are adducts of unsaturated carboxylates or unsaturated carboxamides having a nucleophilic substituent such as hydroxyl, amino or mercapto group, with monofunctional or polyfunctional isocyanates or epoxides; and dehydrated polycondensates of such unsaturated carboxylates or carboxamides with monofunctional or polyfunctional carboxylic acids.

Also preferred for use herein are adducts of unsaturated carboxylates or amides having an electrophilic substituent such as isocyanate or epoxy group, with monofunctional or polyfunctional alcohols, amines or thiols; and substitution products of unsaturated carboxylates or amides having a leaving substituent such as halogen or tosyloxy group, with monofunctional or polyfunctional alcohols, amines or thiols.

Still other examples also preferred for use herein are compounds corresponding to those mentioned above in which, however, the unsaturated carboxylic acids are replaced with unsaturated phosphonic acids or chloromethylstyrenes.

Of the polymerizing esters of unsaturated carboxylic acids with aliphatic polyalcohols, acrylates include, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tris(acryloyloxyethyl) isocyanurate, and polyester acrylate oligomers.

Methacrylates include, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]-dimethoxymethane, and bis-[p-(methacryloyloxyethoxy)phenyl]dimethylmethane.

Itaconates include, for example, ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Crotonates include, for example, ethylene glycol dicrotonate, tetramethylene glycol dicrotonate, pentaerythritol dicrotonate, and sorbitol tetra/dicrotonate.

Isocrotonates include, for example, ethylene glycol diisocrotonate, pentaerythritol diisocrotonate, and sorbitol tetraisocrotonate.

Maleates include, for example, ethylene glycol dimaleate, triethylene glycol dimaleate, pentaerythritol dimaleate, and sorbitol tetramaleate.

Other esters also usable herein are aliphatic alcohol esters described in JP-B Nos. 46-27926, 51-47334, 57-196231; aromatic skeleton-having esters described in JP-A Nos.

59-5240, 59-5241, 2-226149: and amino group-having esters described in JP-A No. 1-165613.

Examples of the amide monomers of aliphatic polyamine compounds with unsaturated carboxylic acids are methylenebis-acrylamide, methylenebis-methacrylamide, 1,6-hexamethylenebis-acrylamide, 1,6-hexamethylenebis-methacrylamide, diethylenetriamine-trisacrylamide, xylylenebisacrylamide, and xylylenebismethacrylamide.

Other amide monomers also preferred for use herein are those having a cyclohexylene structure described in, for example, JP-B No. 54-21726.

Urethane-based polyadducts produced through addition reaction of isocyanates with a hydroxyl group are also preferred for use in the invention. Specifically, for example, there are mentioned urethane compounds having at least two polymerizing unsaturated groups in one molecule, which are obtained by adding a hydroxyl group-having unsaturated monomer of the following formula (I) to a polyisocyanate compound having at least two isocyanate groups in one molecule. These are described in JP-B No. 48-41708.

$$CH_2{=}C(R^1)COOCH_2CH(R^2)OH \qquad (I)$$

wherein $R^1$ and $R^2$ each represent H or $CH_3$.

Also preferred for use in the invention are urethane acrylates described in JP-A No. 51-37193, and JP-B Nos. 2-32293, 2-16765: and ethylene oxide-based urethane compounds described in JP-B Nos. 58-49860, 56-17654, 62-39417, 62-39418.

Also preferred are radical-polymerizing compounds having an amino structure or a sulfido structure in the molecule, described in JP-A Nos. 63-277653, 63-260909, 1-105238.

Other examples also preferred for use in the invention are polyfunctional acrylates and methacrylates, such as polyester acrylates and epoxy acrylates obtained through reaction of epoxy resins with (meth)acrylic acid, described in JP-A No. 48-64183, and JP-B Nos. 49-43191, 52-30490. Also preferred are specific unsaturated compounds described in JP-B Nos. 46-43946, 1-40337, 1-40336; and vinylphosphonic acid compounds described in JP-A No. 2-25493. As the case may be, perfluoroalkyl group-having compounds descried in JP-A No. 61-22048 are also preferred. Further, photocurable monomers and oligomers introduced in the *Journal of the Adhesive Association of Japan*. Vol. 20, No. 7, pp. 300–308 (1984) are also preferred.

Preferred epoxy compounds are, for example, glycerin polyglycidyl ether, polyethylene glycol diglycidyl ether, polypropylene glycol diglycidyl ether, trimethylolpropane polyglycidyl ether, sorbitol polyglycidyl ether, and polyglycidyl ethers of bisphenols or polyphenols or their hydrides.

Preferred isocyanate compounds are, for example, tolylene diisocyanate, diphenylmethane diisocyanate, polymethylene-polyphenyl polyisocyanate, xylylene diisocyanate, naphthalene diisocyanate, cyclohexanephenylene diisocyanate, isophorone diisocyanate, hexamethylene diisocyanate, cyclohexyl diisocyanate, and their derivatives blocked with alcohols or amines.

Preferred amine compounds are, for example, ethylenediamine, diethylenetriamine, triethylenetetramine, hexamethylenediamine, propylenediamine, and polyethylenimine.

Preferred hydroxyl group-having compounds are, for example, methylol-terminated compounds, polyalcohols such as pentaerythritol, bisphenols and polyphenols.

Preferred carboxyl group-having compounds are, for example, aromatic polycarboxylic acids such as pyromellitic acid, trimellitic acid, phthalic acid; and aliphatic polycarboxylic acids such as adipic acid.

Preferred acid anhydrides are, for example, pyromellitic anhydride, and benzophenonetetracarboxylic anhydride.

Preferred copolymers of ethylenic unsaturated compounds are, for example, allyl methacrylate copolymers. Specifically, they include allyl methacrylate/methacrylic acid copolymers, allyl methacrylate/ethyl methacrylate copolymers, and allyl methacrylate/butyl methacrylate copolymers.

For forming microcapsules, any known method is employable. For it, for example, there are mentioned a method of coacervation described in U.S. Pat. Nos. 2,800, 457, 2,800,458; a method of interfacial polymerization described in British Patent No. 990,443, U.S. Pat. No. 3,287,154, JP-B Nos. 38-19574, 42-446, 42-711; a method of polymer precipitation described in U.S. Pat. Nos. 3,418, 250, 3,660,304; a method of using an isocyanate-polyol wall-forming material described in U.S. Pat. No. 3,796,669; a method of using an isocyanate wall-forming material described in U.S. Pat. No. 3,914,511; a method of using an urea-formaldehyde or urea-formaldehyde-resorcinol wall-forming material described in U.S. Pat. Nos. 4,001,140, 4,087,376, 4,089,802; a method of using a melamine-formaldehyde resin or hydroxy cellulose wall -forming material described in U.S. Pat. No. 4,025,445; a method of in-situ polymerization of monomers described in JP-D Nos. 36-9163, 51-9079; a spray-drying method described in British Patent No. 930,422 and U.S. Pat. No. 3,111,407; and an electrolytic dispersion cooling method described in British Patent Nos. 952,807, 967,074. However, the invention is not limited to these methods.

The microcapsule walls preferred for the microcapsules (b) have a three-dimensional crosslinked structure, and they swell in solvents. From this viewpoint, it is desirable that the wall material for the microcapsules is polyurea, polyurethane, polyester, polycarbonate, polyamide or their mixtures. Especially preferred are polyurea and polyurethane. If desired, a thermo-reactive functional group-having compound may be introduced into the microcapsule walls.

Preferably, the mean particle size of the microcapsules (b) is from 0.01 to 20 μm, more preferably from 0.05 to 2.0 μm, even more preferably from 0.10 to 1.0 μm. Within the range, the microcapsules ensure good image resolution and storage stability of the image-forming layer containing them.

In the image-forming mechanism that uses the thermo-reactive functional group-having microcapsules (b), any of the microcapsule material, the compound in the microcapsules and other optional components existing in the thermal recording layer that contains the microcapsules dispersed therein shall react with each other to form an image region, or that is, a hydrophobic region (ink-acceptable region). Various embodiments will satisfy the requirement. For example, one is that the microcapsules fuse to each other when exposed to heat, as in the manner mentioned hereinabove; another is that a part of the encapsulated compound having bled out in the outer surfaces of the microcapsules or completely outside the microcapsules in the coating step of applying the microcapsule dispersion onto the hydrophilic layer, or an outer compound having penetrated into the microcapsules also in the coating step undergoes chemical reaction under heat; and still another is that the microcapsule material or the encapsulated compound reacts with the hydrophilic resin added thereto or reacts with a low-molecular compound also added thereto; and still another is that at least two different types of microcapsule wall materials or compounds to be encapsulated are so designed that they have different functional groups capable of undergoing thermal reaction with each other, and the microcapsules can react with each other. The invention applies to any of such different types for image formation.

Accordingly, the thermal fusion of microcapsules is one preferred embodiment for image formation but is not indispensable in the invention.

Preferably, the amount of the microcapsules (b) to be added to the thermal recording layer falls between 10 and 60% by weight, more preferably between 15 and 40% by weight of the solid content of the layer. Within the range, the thermal recording layer ensures good in-printer development and high sensitivity to form good images of good printing service durability.

In case where the microcapsules (b) are added to the thermal recording layer, a solvent capable of dissolving the compound encapsulated in the microcapsules and capable of swelling the capsule wall material may be added to the dispersant for the microcapsules. The solvent promotes the diffusion of the encapsulated, thermo-reactive functional group-having compound, out of the microcapsules.

Selecting the solvent depends on the dispersant for the microcapsules, the wall material for the microcapsules, the wall thickness and the contents of the microcapsules, but the solvent may be readily selected from many commercial products. For example, for water-dispersible microcapsules of which the walls are made of crosslinked polyurea or polyurethane, the solvent is preferably selected from alcohols, ethers, acetals, esters, ketones, polyalcohols, amides, amines and fatty acids.

Specifically, the solvent includes, for example, methanol, ethanol, tert-butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide and N,N-dimethylacetamide, to which, however, the invention is not limited. If desired, two or more of such solvents may be combined for use herein.

A solvent not dissolving in the microcapsule dispersion by itself, but capable of dissolving therein when combined with the solvent mentioned above may also be used. The amount of the solvent that may be in the microcapsule dispersion shall be determined, depending on the combination of the materials to form the microcapsules. However, if the amount of the solvent is lower than a proper level, the image formation will be unsatisfactory; but if too large, the dispersion will be unstable. In general, the amount of the solvent is preferably from 5 to 95% by weight, more preferably from 10 to 90% by weight, even more preferably from 15 to 85% by weight of the coating liquid for the thermal recording layer.

Other Components:

The thermal recording layer (image-forming layer) of the planographic printing plate precursor of the invention may contain, if desired, any other various compounds for getting various properties.

For example, the image-forming layer of the planographic printing plate precursor may contain a dye having high absorption in the visible light range, in which the dye serves as an image colorant.

The dye facilitates differentiation of the image area from the non-image area in the image-formed plate, and it is desirable to add the dye to the image-forming layer. The amount of the dye that may be in the image-forming layer is from 0.01 to 10% by weight of the total solid content of the layer.

The image-forming layer of the planographic printing plate precursor of the invention may contain any of nonionic surfactants described in JP-A Nos. 62-251740 and 3-208514, and ampholytic surfactants described in JP-A Nos. 59-121044 and 4-13149, for broadening the latitude in stable processing of the precursor in various conditions for development.

The amount of the nonionic surfactant or the ampholytic surfactant that may be in the image-forming layer of the planographic printing plate precursor is preferably from 0.05 to 15% by weight, more preferably from 0.1 to 5% by weight of the layer.

Also if desired, the image-forming layer in the invention may contain a plasticizer for making the layer flexible. For example, the plasticizer includes butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

In the invention, the image-forming layer may be formed by dissolving the above-mentioned components in a solvent and applying the resulting solution onto the hydrophilic layer or onto the hydrophilic surface of the support of the layer.

The solvent usable herein includes, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulforane, γ-butyrolactone, toluene and water, to which, however, the invention is not limited. One or more of these solvents may be used either singly or in combination.

The concentration of the constituent components (total solid content including additives) in the solvent is preferably from 1 to 50% by weight. The dry weight (in terms of the solid content) of the image-forming layer formed on the hydrophilic layer varies, depending on the use thereof. In general, it is preferably from 0.5 to 5 0 g/$m^2$ for planographic printing plate precursors. When the coating amount of the layer is lower, the apparent sensitivity of the layer formed is higher but the film properties of the layer worsens.

For forming the image-forming layer, various coating methods are employable. For example, employable are bar coating, spin coating, spraying, curtain coating, dipping, air knife coating, blade coating and roll coating.

The image-forming layer of the planographic printing plate precursor of the invention may contain a surfactant having the ability to improve the coatability of the layer. For example, it may contain a fluorine-containing surfactant as in JP-A No. 62-170950. Preferably, the amount of the surfactant to be in the image-forming layer is from 0.01 to 1% by weight, more preferably from 0.05 to 0.5% by weight of the total solid content of the layer.

The planographic printing plate precursor of the invention thus fabricated in the manner as above may be imagewise exposed and developed in any known manner into a planographic printing plate.

The support of the planographic printing plate precursor of the invention has a smooth hydrophilic surface of good durability and workability, and its surface keeps good hydrophilicity for long. Therefore, when a desired image-forming layer is formed on the support to fabricate a planographic printing plate precursor and when the precursor is processed into a printing plate, the resulting printing plate gives a large number of prints with no stains in the non-image area, irrespective of the constitution of the image-forming layer formed on the support.

In accordance with its object, the thermal recording layer of the planographic printing plate precursor of the third aspect of the invention may contain any other various additives such as those mentioned below, in addition to the image-forming polymer particles (a) having a thermo-reactive functional group or the microcapsules (b) with a thermo-reactive functional group-having compound therein that are in the layer.

Reaction Initiator, Reaction Promoter:

A compound having the ability to initiate or promote the reaction in the thermal recording layer may be added to the layer, if desired. The compound to initiate or promote the reaction is, for example, a compound that generates a radical or cation when exposed to heat. Specifically, for example, it includes olefin dimers, trihalomethyl compounds, peroxides, azo compounds, onium salts such as diazonium salts or diphenyliodonium salts, acylphosphines and imidosulfonates.

Preferably, the amount of the compound to be added to the thermal recording layer is from 1 to 20% by weight, more preferably from 3 to 10% by weight of the solid content of the layer. Within the range, the compound is effective for initiating or promoting the reaction, not detracting from the in-printer developability of the printing plate precursor.

Hydrophilic Resin:

The thermal recording layer in the invention may optionally contain a hydrophilic resin. Containing it, the layer ensures better in-printer developability and higher film strength of the layer.

Preferably, the hydrophilic resin that may be in the layer has a hydrophilic group of, for example, hydroxyl, carboxyl, hydroxyethyl, hydroxypropyl, amino, aminoethyl, aminopropyl or carboxymethyl group.

Examples of the hydrophilic resin are arabic gum, casein, gelatin, starch derivatives, carboxymethyl cellulose and its salts, cellulose acetate, sodium alginate, vinyl acetate-maleic acid copolymers, styrene-maleic acid copolymers, polyacrylic acids and their salts, polymethacrylic acids and their salts, hydroxyethyl methacrylate homopolymers and copolymers, hydroxyethyl acrylate homopolymers and copolymers, hydroxypropyl methacrylate homopolymers and copolymers, hydroxypropyl acrylate homopolymers and copolymers, hydroxybutyl methacrylate homopolymers and copolymers, hydroxybutyl acrylate homopolymers and copolymers, polyethylene glycols, hydroxypropylene polymers, polyvinyl alcohols, as well as hydrolyzed polyvinyl acetates having a degree of hydrolysis of at least 60% by weight, preferably at least 80% by weight, polyvinylformals, polyvinylbutyrals, polyvinylpyrrolidones, acrylamide homopolymers and copolymers, methacrylamide homopolymers and copolymers, and N-methylolacrylamide homopolymers and copolymers.

The amount of the hydrophilic resin to be in the thermal recording layer is preferably from 5 to 40% by weight, more preferably from 10 to 30% by weight of the solid content of the layer. Within the range, the thermal recording layer ensures good in-printer developability and high film strength.

Photo-thermal Converting Agent:

In case where the planographic printing plate precursor of the invention is processed through scanning exposure to laser rays for image formation thereon, it is desirable that the precursor contains a photo-thermal converting agent having the ability to convert optical energy to heat energy.

The photo-thermal converting agent that may be in the planographic printing plate precursor of the invention may be any and every substance capable of absorbing light of, for example, UV rays, visible light, IR rays or white light to convert it into heat. For example, it includes carbon black, carbon graphite, pigment, phthalocyanine pigment, metal powder and metal compound powder. Especially preferred are dyes, pigments, metal powders and metal compound powders capable of effectively absorbing IR rays of from 760 nm to 1200 nm.

For the photo-thermal converting agent, herein usable are commercial pigments and pigments disclosed in *Color Index (C.I.) Handbook, Latest Pigment Handbook* (edited by the Pigment Technology Association of Japan, 1977), *Latest Pigment Application Technology* (published by CMC, 1986) and *Printing Ink Technology* (published by CMC, 1964).

Specifically, the pigments employable herein are black pigments, yellow pigments, orange pigments, brown pigments, red pigments, purple pigments, blue pigments, green pigments, fluorescent pigments, metal powder pigments, and polymer-bonded colorants. More specifically, they are insoluble azo pigments, azo-lake pigments, condensed azo pigments, chelate-azo pigments, phthalocyanine pigments, anthraquinone pigments, perylene and perinonepigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black.

These pigments for use herein may be surface-treated or not. For surface-treating them, for example, the pigment particles may be coated with hydrophilic resin or oleophilic resin; or a surfactant may be adhered to them; or a reactive substance (e.g., silica sol, alumina sol, silane coupling agent, epoxy compound, polyisocyanate) may be bonded to the surfaces of the pigment particles. The surface treatment is described, for example, in *Properties and Applications of Metal Soap* (by Miyuki Shobo), *Printing Ink Technology* (by CMC, 1984), and *Latest Pigment Application Technology* (by CMC, 1986). Of the pigments mentioned above, preferred for use herein are those that absorb IR rays, since they are applicable to IR-emitting laser treatment. Of the IR-absorbing pigments, preferred is carbon black.

Preferably, the particle size of the pigment for use herein is from 0.01 μm to 1 μm, more preferably from 0.01 μm to 0.5 μm.

The dyes that serve as the photo-thermal converting agent may be any known ones, including those available as commercial products, those described in literature (e.g., in *Dye Handbook,* edited by the Organic Synthetic Chemistry Association of Japan, 1970), near-IR-absorbing dyes described in *Chemical Industry,* May 1986, pp. 45–51, and other known dyes described in *Development and Market Trend of Functional Dyes in the* 1990'*s*, Chapter 2, Item 2.3 (by CMC in 1990).

Specifically, IR-absorbing dyes are preferred for use herein, including, for example, are azo dyes, metal complexed azo dyes, pyrazolonazo dyes, anthraquinone dyes, phthalocyanine dyes, carbonium dyes, quinonimine dyes, polymethine dyes and cyanine dyes.

More specifically, for example, preferred are cyanine dyes as in JP-A Nos. 58-125246, 59-84356, 60-78787; methine dyes as in JP-A Nos. 58-173696, 58-181690, 58-194595; naphthoquinone dyes as in JP-A Nos. 58-112793, 58-224793, 59-48187, 59-73996, 60-52940, 60-63744;

squalilium dyes as in JP-A No. 58-112792; cyanine dyes as in British Patent 434,875; dyes as in U.S. Pat. No. 4,756,993; cyanine dyes as in U.S. Pat. No. 4,973,572; dyes as in JP-A No. 10-268512; and phthalocyanine compounds as in JP-A No. 11-235883.

Also preferred are near IR-absorbing sensitizers as in U.S. Pat. No. 5,156,938; substituted arylbenzo(thio)pyrylium salts as in U.S. Pat. No. 3,881,924; trimethinethiapyrylium salts as in JP-A No. 57-142645; pyrylium compounds as in JP-A Nos. 58-181051, 58-220143, 59-41363, 59-84248, 59-84249, 59-146063, 59-146061; cyanine dyes as in JP-A No. 59-216146; pentamethinethiopyrylium salts as in U.S. Pat. No. 4,283,475; pyrylium compounds as in JP-B Nos. 5-13514, 5-19702; and commercial products, Epolite III-178, Epolite III-130 and Epolite III-125 (all trade name, manufactured by Rpolin).

Still other examples of preferred dyes for use herein are near IR absorbent dyes of (I) and (II) in U.S. Pat. No. 4,756,993.

Some concrete examples are mentioned below.

(IR-1)

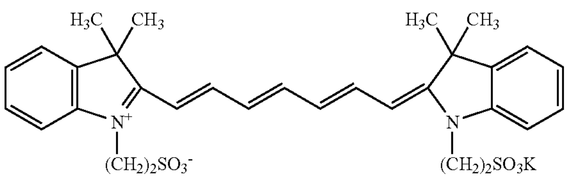

(IR-2)

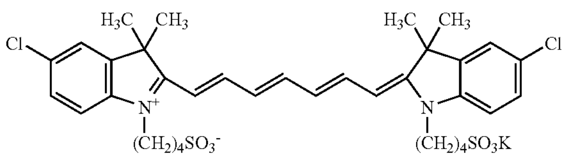

(IR-3)

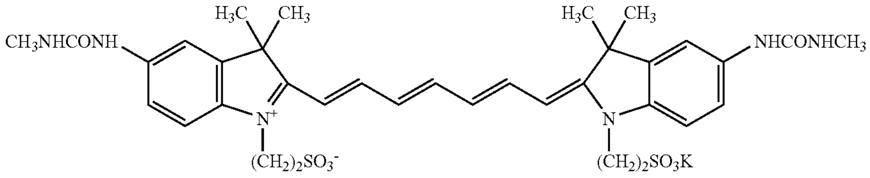

(IR-4)

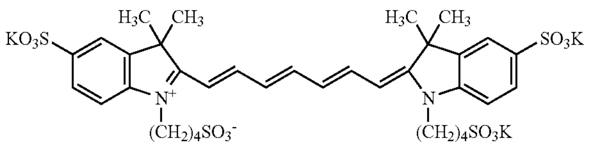

(IR-5)

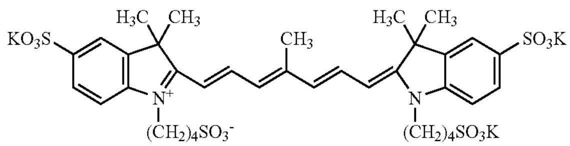

(IR-6)

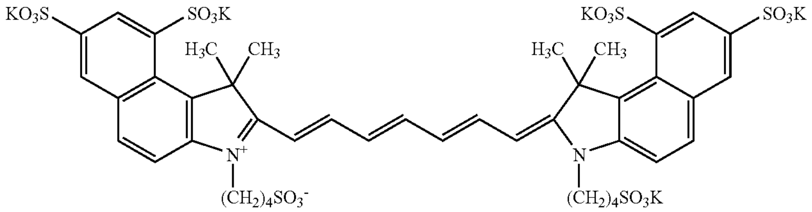

(IR-7)

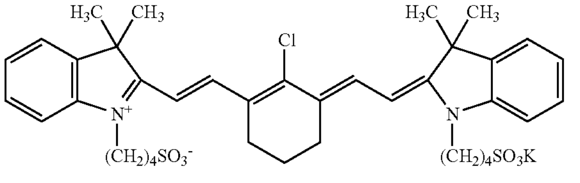

(IR-8)

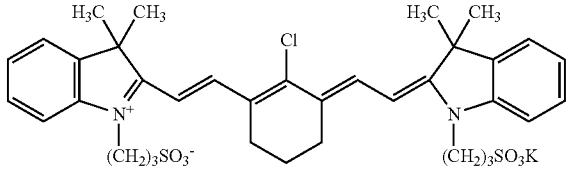

(IR-9)

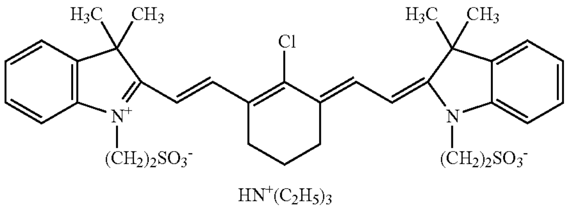

(IR-10)

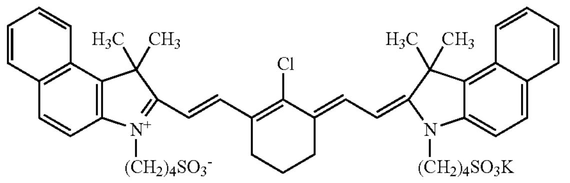

-continued (IR-11)

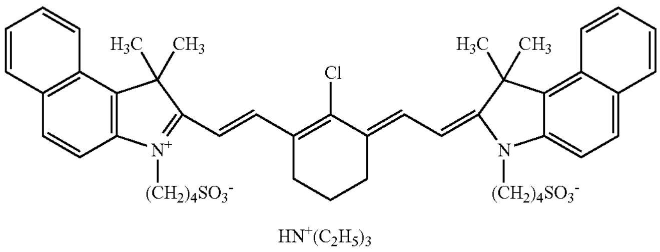

Of those dyes, especially preferred are cyanine dyes, squarylium dyes, pyrylium salts and nickel-thiolate complexes.

The thermal recording layer in the invention may contain metal particles serving as a photo-thermal converting agent. Most metal particles have the capability of photo-thermal conversion, and are self-exothermic. Preferred metal particles for use herein are particles of simple metals or alloys of, for example, Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, Sb, or their oxides or sulfides. More preferred are particles of simple metals or alloys of Ag, Au, Cu, Pt and Pd.

Preferably, the size of the metal particles that serves as a photo-thermal converting agent for use in the invention falls between 1 and 500 nm, more preferably between 1 and 100 nm, even more preferably between 1 and 50 nm.

Regarding the degree of dispersion thereof, the metal particles may be poly-dispersed, but are preferably mono-dispersed having a dispersion fluctuation coefficient of at most 30%.

Regarding the amount of the photo-thermal converting agent that may be in the thermal recording layer, dye or pigment for the agent may account for up to 30% by weight, preferably from 1 to 25% by weight, more preferably from 7 to 20% by weight of the total solid content of the layer.

In case where metal particles are used as the photo-thermal converting agent in the thermal recording layer, the amount of the particles to be added to the may fall between 5 and 50% by weight, but preferably between 10 and 30% by weight, more preferably between 15 and 20% by weight of the total solid content of the layer. Containing the metal particles within the range, the layer has high sensitivity.

Not always in the thermal recording layer, the photo-thermal converting agent may also be in any other layer, for example, in a photo-thermal converting layer disposed adjacent to the thermal recording layer, or in the interlayer having a hydrophilic surface, or in a water-soluble overcoat layer that will be mentioned hereinunder. When at least one of the thermal recording layer, the interlayer and the overcoat layer contains the photo-thermal converting agent, its IR absorption increases and the sensitivity of the thermal recording layer therefore increases.

If further desired, the thermal recording layer in the planographic printing plate precursor of the third aspect of the invention may contain any other various compounds in addition to the above-mentioned ingredients. For example, a polyfunctional monomer may be added to the matrix for the thermal recording layer for further increasing the printing service durability of the layer. For the monofunctional monomer, referred to are the monomers mentioned hereinabove for those to be in the microcapsules. For it, especially preferred is trimethylolpropane triacrylate.

Also if desired, the thermal recording layer in the invention may contain a dye having high absorption in the visible light range, in which the dye serves as an image colorant and facilitates differentiation of the image area from the non-image area in the image-formed plate. Specifically, the dye includes Oil Yellow #101, Oil Yellow #103, Oil Pink #312, Oil Green BG, Oil Blue BOS, Oil Blue #603, Oil Black BY, Oil Black BS, Oil Black T-505 (all by Orient Chemical Industry), Victoria Pure Blue, Crystal Violet (CI 42555), Methyl Violet (CI 42535), Ethyl Violet, Rhodamine B (CI 145170B), Malachite Green (CI 42000), Methylene Blue (CI 52015). as well as the dyes described in JP-A No. 62-293247. Also preferred for the image colorant are pigments such as phthalocyanine pigments, azo pigments, titanium oxide. The amount of the image colorant that may be in the thermal recording layer falls between 0.01 and 10% by weight of the total solid content of the coating liquid for the layer.

Preferably, in the invention, a small amount of a thermal polymerization inhibitor is added to the thermal recording layer for preventing unnecessary thermal polymerization of the ethylenic unsaturated compound in the layer while the layer is formed or while the plate precursor is stored. Suitable examples of the thermal polymerization inhibitor are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminium salt. Preferably, the amount of the thermal polymerization inhibitor to be added to the layer falls between about 0.01% by weight and about 5% by weight of the composition to form the layer.

If desired, a higher fatty acid or its derivative such as behenic acid or behenamide having the ability to prevent polymerization retardation by oxygen may be added to the composition for the thermal recording layer. In the printing plate precursor of the invention, such an acid or acid derivative may be localized in the surface of the thermal recording layer in the step of drying the layer. Preferably, the amount of the higher fatty acid or its derivative in the layer-forming composition falls between about 0.1% by weight and about 10% by weight of the solid content of the layer.

Also if desired, the thermal recording layer may contain a plasticizer for making the layer flexible. For example, the plasticizer includes polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

Formation of Thermal Recording Layer:

In the invention, the thermal recording layer may be formed by dissolving or dispersing the above-mentioned necessary components in a solvent to prepare a coating solution or dispersion followed by and applying the resulting solution or dispersion onto the hydrophilic surface of the support.

The solvent usable herein includes, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulforane, γ-butyrolactone, toluene and water, to which, however, the invention is not limited. One or more of these solvents may be used either singly or in combination. The solid concentration of the coating solution or dispersion preferably falls between 1 and 50% by weight.

The dry weight (in terms of the solid content) of the thermal recording layer varies, depending on the use thereof. In general, it is preferably from 0.5 to 5.0 g/m. When the coating amount of the layer is lower, the apparent sensitivity of the layer formed is higher but the film properties of the layer for image formation thereon worsens.

For forming the thermal recording layer, various coating methods are employable. For example, employable are bar coating, spin coating, spraying, curtain coating, dipping, air knife coating, blade coating and roll coating.

The coating liquid for the thermal recording layer may contain a surfactant having the ability to improve the coatability of the layer. For example, it may contain a fluorine-containing surfactant as in JP-A No. 62-170950. Preferably, the amount of the surfactant to be in the thermal recording layer is from 0.01 to 1% by weight, more preferably from 0.05 to 0.5% by weight of the total solid content of the layer.

Other Constituent Elements:

Overcoat Layer:

In the invention, a water-soluble overcoat layer may be formed on the thermal recording layer of the planographic printing plate precursor for protecting the surface of the thermal recording layer from being contaminated with oleophilic substances. Preferably, the water-soluble overcoat layer can be readily removed while the precursor is processed in printers, and it contains a resin selected from water-soluble organic polymer compounds.

The water-soluble organic polymer compounds for use herein has the ability to form film when applied onto the thermal recording layer and dried thereon. Specifically, they include polyvinyl acetate (having a degree of hydrolysis of at leas 65%), polyacrylic acids and their alkali metal salts and amine salts, polyacrylic acid copolymers and their alkali metal salts and amine salts, polymethacrylic acids and their alkali metal salts and amine salts, polyacrylamides and their copolymers, polyhydroxyethyl acrylates, polyvinyl pyrrolidones and their copolymers, polyvinyl methyl ethers, vinyl methyl ether/maleic anhydride copolymers, poly-2-acrylamido-2-methyl-1-propanesulfonic acids and their alkali metal salts and amine salts, poly-2-acrylamido-2-methyl-l-propanesulfonic acid copolymers and their alkali metal salts and amine salts, arabic bum, cellulose derivatives (e.g., carboxymethyl cellulose, carboxyethyl cellulose, methyl cellulose) and their modified derivatives, white dextrin, pullulan, and enzyme-degraded etherified dextrin. If desired, two or more of these resins may be combined for use herein.

If desired, the overcoat layer may contain a water-soluble photo-thermal converting agent such as that mentioned hereinabove. When the overcoat layer is formed of an aqueous coating solution, the solution may contain a nonionic surfactant such as polyoxyethylene nonylphenyl ether or polyoxyethylene dodecyl ether for ensuring the uniformity of the overcoat layer formed of it.

The dry weight of the overcoat layer preferably falls between 0.1 and 2.0 g/m$^2$. Within the range, the overcoat layer does not detract from the in-printer developability of the thermal recoding layer, and it protects the surface of the thermal recording layer from being contaminated or soiled with oleophilic substances and fingerprints.

Printing Plate Making and Printing:

The planographic printing plate precursor of the invention thus fabricated in the manner as above is exposed to heat or radiations for image formation thereon. Specifically, the precursor is processed with a thermal recording heat for direct image formation thereon; or it is exposed to IR laser in a mode of laser scanning; or it is exposed to high-intensity flash light from a xenon arc lamp or the like, or is exposed to an IR lamp. Preferably, however, the precursor is exposed to IR rays of from 700 to 1200 nm from solid laser, semiconductor laser, or high-power solid IR laser such as YAG laser.

Thus imagewise exposed, the planographic printing plate precursor of the invention may be directly set in a printer, not undergoing any special development, in which it receives ink and dampening water and acts as a printing plate in an ordinary manner. Specifically, the non-exposed region of the exposed planographic printing plate precursor is readily removed by the action of the water-soluble component in the dampening water applied thereto in the initial stage of the printing operation in the printer in which the exposed precursor has been set, and it forms a non-image area.

Like in Japanese Patent No. 2,938,398, the planographic printing plate precursor of the invention may be set on the cylinder of a printer, then exposed to light from the laser mounted on the printer, and thereafter developed with dampening water and/or ink in the printer.

As the case may be, the planographic printing plate precursor of the invention may be developed with water or a suitable aqueous solution that serves as a developer, and then the resulting printing plate may be used to produce prints.

The planographic printing plate precursor of the invention has a thermal recording layer formed on a support coated with a hydrophilic layer, in which the hydrophilicity of the hydrophilic layer is high and the adhesiveness thereof to the support substrate is good. Therefore, high-sensitivity image formation is possible on the plate precursor. In particular, even the region around the support of the precursor enables good image formation therein. Therefore, the exposed precursor may be directly set in a printer for directly giving prints. In other words, the precursor of the invention is suitable to in-printer development after imagewise exposure, since the non-image area thereof is readily removed by the action of the hydrophilic component of the dampening water applied thereto in the printer in which the exposed precursor has been set.

EXAMPLES

The invention is described in more detail with reference to the following Examples, to which, however, the invention is not limited.

Production of Polymerizing Group-having Hydrophilic Polymer:

18 g of polyacrylic acid (mean molecular weight: 25,000) was dissolved in 300 g of DMAC, and 0.41 g of hydroquinone, 19.4 g of 2-methacryloyloxyethyl isocyanate and 0.25 g of dibutyltin dilaurate were added thereto, and reacted at 65° C. for 4 hours. The acid value of the resulting polymer was 7.02 meq/g. The carboxyl group of the polymer was neutralized with an aqueous 1 N sodium hydroxide solution. Thus neutralized, the polymer was deposited in ethyl acetate added thereto, and the resulting deposit was well washed. The yield of the hydrophilic polymer (P-1) having a polymerizing group at its side chains was 18.4 g.

Production of Polymerizing Group-terminated Amide Macromonomer:

30 g of acrylamide and 3.8 g of 3-mercaptopropionic acid were dissolved in 70 g of ethanol and heated up to 60° C. in a nitrogen atmosphere. 300 mg of AIBN (2,2-azobisisobutyronitrile) was added thereto and reacted for 6 hours. After the reaction, the white deposit formed was taken out through filtration and well washed with methanol. This is a carboxyl-terminated prepolymer and its yield was 30.8 g. It has an acid value of 0.787 meq/g, and a molecular weight of $1.29\times10^3$.

20 g of the prepolymer was dissolved in 62 g of dimethyl sulfoxide, and 6.71 g of glycidyl methacrylate, 504 mg of N,N-dimethyldodecylamine (catalyst) and 62.4 mg of hydroquinone (polymerization inhibitor) wee added thereto, and reacted at 140° C. in a nitrogen atmosphere for 7 hours. The reaction mixture was put into acetone, in which the polymer was deposited. The resulting deposit was well washed. This is a methacrylate-terminated macromonomer (P-2), and its yield was 23.4 g. It has a molecular weight of $1.43\times10^3$.

Example 1-1

Formation of Polymerizing Lower Layer:

Using a rod bar #17, a polymerizing under layer coating liquid mentioned below was applied onto a PET film (trade name: M4100, manufactured by Toyobo) having a thickness of 0.188 mm, and dried at 80° C. for 2 minutes.

Next, the coated film was exposed to a 400 W high-pressure mercury lamp (trade name: UVL-400P, manufactured by Riko Scientific Industry) for 10 minutes to cure the coating liquid to thereby form a polymerizing lower layer on the film.

Coating Liquid for Polymerizing Lower Layer:

| | |
|---|---|
| Allyl methacrylate/methacrylic acid copolymer (molar ratio 80/20, having a molecular weight of 100,000) | 4 g |
| Ethylene oxide-modified bisphenol A diacrylate (trade name: M210, manufactured by Toa Gosei) | 4 g |
| 1-Hydroxycyclohexyl phenyl ketone | 1.6 g |
| 1-Methoxy-2-propanol | 16 g |

Formation of Upper Layer:

Using a rod bar #6, a coating liquid composition 1 for upper layer mentioned below was applied onto the polymerizing lower layer-coated support, and dried at 80° C. for 2 minutes. The surface of the upper layer formed of the coating liquid composition 1 was uniform.

Energy was applied to the surface of the thus-obtained hydrophilic member precursor in the manner mentioned below to fabricate a hydrophilic member.

Specifically, the precursor was exposed to a 400 W high-pressure mercury lamp (trade name: UVL-400P, manufactured by Riko Scientific Industry) in an argon atmosphere for 80 minutes for applying energy thereto. After thus exposed, the resulting film was well washed with ion-exchanged water. This is a hydrophilic member 1-1 with hyperbranch-structured hydrophilic graft chains.

Coating Liquid Composition 1 for Upper Layer:

| Hydrophilic polymer (P-1) with polymerizing group in its side | |
|---|---|
| chains | 2 g |
| Water | 18 g |

The surface of the thus-obtained hydrophilic member 1-1 was visually observed, and its smoothness was good. Using a hydrophilicity tester (trade name: CA-Z, manufactured by Kyowa Surface Science), the surface hydrophilicity of the member 1-1 was measured. As a result, the contact angle of the member 1-1 (to water drops in air) was 15.0°, and this confirms that the surface hydrophilicity of the member 1-1 is good.

Example 1-2

A hydrophilic member 1-2 was fabricated in the same manner as in Example 1-1, for which, however, a coating liquid composition 2 for upper layer mentioned below was used in place of the coating liquid composition 1. In the process of fabricating the member 1-2, the surface smoothness of the upper layer formed of the coating liquid composition 2 was uniform.

| Coating liquid composition 2 for upper layer: | |
|---|---|
| Acrylamide macromonomer | 2 g |
| Water | 18 g |

The surface of the thus-obtained hydrophilic member 1-2 was visually observed, and its smoothness was good. Using a hydrophilicity tester (trade name: CA-Z, manufactured by Kyowa Surface Science), the surface hydrophilicity of the member 1-2 was measured. As a result, the contact angle of the member 1-2 (to water drops in air) was 18.0°, and this confirms that the surface hydrophilicity of the member 1-2 is good.

Example 2-1

According to the process mentioned above, 18.4 g of the hydrophilic polymer (P-1) was produced. Using a rod bar #17, the polymerizing under layer coating liquid of the same composition as in Example 1-1 was applied onto a PET film (trade name: M4100, manufactured by Toyobo) having a thickness of 0.188 mm, and dried at 80° C. for 2 minutes. The coated film was exposed to a 400 W high-pressure mercury lamp (trade name: UVL-400P, manufactured by Riko scientific Industry) for 10 minutes to cure the coating liquid to thereby form a polymerizing lower layer on the film.

Formation of Hydrophilic Polymer-containing Layer:

Using a rod bar #6, a coating liquid 1 for hydrophilic polymer-containing layer mentioned below was applied onto the support having the ability to initiate polymerization, and dried at 80° C. for 2 minutes to obtain a pattern forming material 2-1. In the process of fabricating the material 2-1, the surface smoothness of the hydrophilic polymer-containing layer formed of the coating liquid 1 was uniform.

| Coating liquid 1 for hydrophilic polymer-containing layer: Hydrophilic polymer (P-1) with polymerizing group in its side | |
|---|---|
| chains | 2 g |
| Water | 18 g |

Image Formation:

Energy was applied to the surface of the thus-obtained pattern forming material 2-1 in the manner mentioned below to thereby form an imagewise hydrophilic pattern thereon.

Specifically, covered with an image film, the pattern forming material was exposed to a 400 W high-pressure mercury lamp (trade name: UVL-400P, manufactured by Riko Scientific Industry) in an argon atmosphere for 80 minutes for applying energy thereto. After thus exposed, the resulting film was well washed with ion-exchanged water, and a hydrophilic pattern that follows the image film was formed thereon.

Next, the patterned material was dipped in an aqueous solution of 0.1 wt. % methylene blue (from Wako Pure Chemical Industries) for 10 minutes, and then washed with distilled water. Thus processed, methylene blue selectively adhered to the non-exposed area of the material and gave a sharp blue image on the material.

Example 2-2

Production of Polymerizing Group-terminated Amide Macromonomer:

In the same manner as above, 23.4 g of a methacrylate-terminated macromonomer (P-2) having a molecular weight of $1.43\times10^3$ was obtained.

Using a coating liquid 2 for hydrophilic polymer-containing layer mentioned below in place of the coating liquid 1 in Example 2-1, a pattern forming material 2-2 was fabricated in the same manner as in Example 2-1. In the process of fabricating the material 2-2, the surface smoothness of the hydrophilic polymer-containing layer formed of the coating liquid 2 was uniform.

| Coating liquid 2 for hydrophilic polymer-containing layer: | |
|---|---|
| Acrylamide macromonomer (P-2) | 2 g |
| Water | 18 g |

Application to Planographic Printing Plate Precursor:

In the same manner as in Example 2-1, energy was applied to the surface of the thus-obtained pattern forming material 2-2 to thereby form an imagewise hydrophilic pattern thereon.

Next, the patterned material was set in a lithlon printer, which was then driven in an ordinary manner to produce prints with dampening water (containing IF201 (2.5%) and IF202 (0.75%) both trade names of from Fuji Photo Film) and ink (trade name, GEOS-G Black from Dai-Nippon Ink Chemical Industry) being applied thereto.

The prints thus obtained were inspected as to whether the image area formed is good and the non-image area is not stained. As a result, it was found that the image on every print was good with neither imageless spots in the image area nor stains in the non-image area thereof.

After that, the printing operation was continued to obtain 10,000 prints. Even at the end of the printing operation to obtain 10,000 prints, the image area in every print did not blur and the non-image area therein was not stained. All the prints obtained were good. This confirms that the pattern forming material of the invention used in a planographic printing plate precursor gives good images of high image quality and the printing service durability of the printing plate with the patterned material is good.

Example 2-3

Energy was applied to the surface of the pattern forming material 2-1 obtained in Example 2-1 to form a hydrophilic pattern on the material. The patterned material was applied to a planographic printing plate precursor and set in a printer, which was then driven in the same manner as in Example 2-2 to obtain 10,000 prints. All the prints had good image quality, and the printing service durability of the printing plate was good.

Example 3-1

18.4 g of the hydrophilic polymer (P-1) was produced in the same manner as in Example 1-1. Using a rod bar #17, the same coating liquid (photopolymerizing composition) for polymerizing lower layer as in Example 1-1 was applied onto a PET film (trade name: M4100, manufactured by Toyobo) having a thickness of 0.188 mm, and dried at 80° C. for 2 minutes. The thus-coated film was exposed to a 400 W high-pressure mercury lamp (trade name: UVL-400P, manufactured by Riko Scientific Industry) for 10 minutes to cure the coating layer to thereby form a polymerizing undercoat layer thereon.

Formation of Hydrophilic Polymer-containing Layer:

Using a rod bar #6, the same coating liquid 1 for hydrophilic polymer-containing layer as in Example 2-1 was applied onto the support substrate coated with the polymerizing undercoat layer, and dried at 80° C. for 2 minutes. Then, this was exposed to a 400 W high-pressure mercury lamp (trade name: UVL-400P, manufactured by Riko Scientific Industry) for 10 minutes to thereby form a hydrophilic surface on the substrate. This is a support 3-1 for planographic printing plates. Using a hydrophilicity tester (trade name: CA-Z, manufactured by Kyowa Surface Science), the surface hydrophilicity of the support 3-1 was measured. As a result, the contact angle of the support 3-1 to water drops in air was 15.0°, and this confirms that the surface hydrophilicity of the support 3-1 is good.

The surface of the thus-obtained support 3-1 for planographic printing plates was coated with a coating liquid A for positive image-forming layer mentioned below, to such a degree that the dry weight of the image-forming layer formed could be 2.5 $g/m^2$, and dried at 80° C. for 5 minutes. Thus having the image-forming layer formed thereon, this is a planographic printing plate precursor of Example 3-1.

| Coating liquid A for positive image-forming layer: This is a conventional positive image-forming material of an alkali-soluble polymer of naphthoquinone-1,2-idiazide, comprising the following ingredients: | |
|---|---|
| Ester of naphthoquinone-1,2-diazido-4-sulfonyl chloride with pyrogallol-acetone resin | 0.9 g |
| Victoria Pure Blue BOH | 0.05 g |
| Novolak resin obtained from cresol and formaldehyde (meta/para ratio, 6/4, having a weight-average molecular weight of 1800) | 2.0 g |
| Methyl ethyl ketone | 20 g |
| Methyl alcohol | 7 g |

Evaluation of Planographic Printing Plate Precursor:

The positive planographic printing plate precursor obtained in Example 3-1 was imagewise exposed to a PS light via a step guide (from Fuji Photo Film), and then developed in an automatic developing machine filled with a developer (trade name: DP-4 (1:8) manufactured by Fuji Photo Film) to give a planographic printing plate. The planographic printing plate was set in a printer (trade name: KOR-D, manufactured by Heidelberg) and the printer was driven.

The prints thus obtained were inspected as to whether the image area formed is good and the non-image area is not stained, As a result, it was found that the image on every print was good with neither imageless spots in the image area nor stains in the non-image area thereof After that, the printing operation was continued to obtain 4,000 prints. All the prints were good with no stain in the non-image area thereof. This confirms that the printing plate precursor with the support of the invention gives good images of high image quality and the printing service durability of the printing plate from the precursor is good.

Example 3-2

The same support 3-1 for planographic printing plates as that obtained in Example 3-1 was coated with a coating liquid B for negative image-forming layer mentioned below, to such a degree that the dry weight of the image-forming layer formed could be 2.5 g/m$^2$, and dried at 80° C. for 5 minutes. Thus having the image-forming layer formed thereon, this is a planographic printing plate precursor of Example 3-2.

| Coating liquid B for negative image-forming layer: | |
|---|---|
| IR absorbent (trade name: IRG22, manufactured by Nippon Kayaku) | 0.1 g |
| Crosslinking agent A [hexamethoxymethylated 1-[α-methyl-α-(4-hydroxyphenyl)ethyl]-4-[α, α-bis (4-hydroxyphenyl) ethyl]benzene] | 0.21 g |
| Phenol-formaldehyde novolak (having a weight-average molecular weight of 12000) | 2.1 g |
| Diphenyliodonium-9, 10-dimethoxyanthracene sulfonate | 0.02 g |
| Fluorine-containing surfactant (trade name: Megafac F-176, manufactured by Dai-Nippon Ink Chemical Industry) | 0.06 g |
| Methyl ethyl ketone | 15 g |
| 2-Methoxy-1-propanol | 12 g |

Evaluation of Planographic Printing Plate Precursor:

The negative planographic printing plate precursor of Example 3-2 was imagewise exposed to a heat-mode laser, semiconductor laser (wavelength, 825 nm; beam diameter, 1/e$^2$=6 μm) at a linear speed of 8 m/sec, for which the power of the light intensity on the plate precursor was controlled to be 110 mW, then heated at 110° C. for 1 minutes, and thereafter developed in an automatic developing machine filled with a developer (trade name: DP-4 (1:8). manufactured by Fuji Photo Film) and a rinsing solution (trade name: FR-3 (1:7), manufactured by Fuji Photo Film) to give a planographic printing plate.

The printing surface of the planographic printing plate thus obtained was processed with a gum (trade name: GU-7 (1:1), manufactured by Fuji Photo Film). Then, the printing plate was set in printer (trade name: KOR-D, manufactured by Heidelberg) which was driven to give prints. All the prints obtained were good, having neither imageless spots in the image area nor stains in the non-image area thereof.

After this, the printing operation was further continued to give 6,000 prints, all of which were good with no stains in the non-image area thereof.

The printing test confirms that the negative image-forming planographic printing plate precursor having the support of the invention gives good prints and its printing service durability is good.

Next, to confirm its storage stability, the negative printing plate precursor of Example 3-2 was stored at 45° C. and at a relative humidity of 75% for 7 days, then exposed, developed and used in printing in the same manner as above. The printing plate from the thus-stored precursor also gave good prints with neither imageless spots in the image area nor stains in the non-image area thereof. After this, the printing operation was further continued to give 6,000 prints, all of which were also good. This confirms that the storage stability of the planographic printing plate precursor of the invention is good.

Example 3-3

23.4 g of the methacrylate-terminated macromonomer (P-2) having a molecular weight of 1.43×10$^3$ was produced in the same manner as above.

Using the above-mentioned coating liquid 2 for hydrophilic polymer-containing layer in place of the coating liquid 1 used in Example 3-1, a support 3-3 for planographic printing plate precursors was fabricated in the same manner as in Example3-1. Using a hydrophilicity tester (trade name: CA-Z, manufactured by Kyowa Surface Science), the surface hydrophilicity of the support 3-3 was measured. As a result, the contact angle of the support 3-3 (to water drops in air) was 18.0°, and this confirms that the surface hydrophilicity of the support 3-3 is good.

Formation and Evaluation of Planographic Printing Plate Precursor:

In the same manner as in Example 3-1, a positive image-forming layer was formed on the surface of the support 3-3 to fabricate a planographic printing plate precursor of Example 3-3. The precursor was processed into a printing plate and tried for printing in the same manner as in Example 3-1.

The prints thus obtained were inspected as to whether the image area formed is good and the non-image area is not stained. As a result, it was found that the image on every print was good with neither imageless spots in the image area nor stains in the non-image area thereof.

After that, the printing operation was continued to obtain 6,000 prints, all of which were good. This confirms that the planographic printing plate precursor having the support of the invention gives good images of high image quality and the printing service durability of the printing plate from the precursor is good.

Example 3-4

A negative image-forming layer was formed on the support 3-2 for planographic printing plates obtained in Example 3-2 to fabricate a planographic printing plate precursor of Example 3-4.

This was exposed, developed and tried for printing under the same condition as in Example 3-2, and it gave 6,000 prints which were all good with neither printing failure in the image area nor stains in the non-image area thereof. This confirms that the planographic printing plate precursor of the invention of this example gives good images of high image quality and the printing service durability of the printing plate from the precursor is good.

As demonstrated hereinabove, the support for planographic printing plates of the invention has a hydrophilic surface of high hydrophilicity and its surface is kept hydrophilic for long. Therefore, the support is favorable for planographic printing plates.

The advantages of the planographic printing plate from the precursor having the support of the invention are that it gives good prints with no stain, and even under any sever printing conditions, it all the time gives a large number of prints of high image quality.

Example 4-1

Formation of Interlayer:

Using a rod bar #17, a PET film (M4100 from Toyobo) having a thickness of 0.188 mm was coated with an interlayer of a photopolymerizing composition mentioned below, and dried at 80° C. for 2 minutes. Next, the coated film was exposed to a 400 W high-pressure mercury lamp (trade name: UVL-400P, manufactured by Riko Scientific Industry) for 10 minutes.

The composition for the interlayer comprises the following ingredients;

| | |
|---|---|
| Allyl methacrylate/methacrylic acid copolymer (molar ratio 80/20, having a molecular weight of 100,000) | 4 g |
| Ethylene oxide-modified bisphenol A diacrylate (trade name: M210, manufactured by Toa Gosei) | 4 g |
| 1-Hydroxycyclohexyl phenyl ketone | 1.6 g |
| 1-Methoxy-2-propanol | 16 g |

The coating liquid 1 for hydrophilic polymer-containing layer that had been prepared in the same manner as above was applied onto the interlayer to fabricate a support 4-1 having a hydrophilic polymer-containing layer for planographic printing plate precursors.

Production of Thermo-reactive Functional Group-having Polymer Particles:

200 ml of an aqueous solution of polyoxyethylene nonyl phenyl ether (concentration, $9.84\times10^{-3}$ mol/liter) was added to 7.5 g of allyl methacrylate and 7.5 g of butyl methacrylate, and the resulting system was purged with nitrogen gas with stirring at 250 rpm. The resulting solution was kept at 25° C., and 10 ml of an aqueous solution of ammonium cerium (IV) (concentration, $0.984\times10^{-3}$ mol/liter) was added thereto. In this step, an aqueous solution of ammonium nitrate (concentration, $58.8\times10^{-3}$ mol/liter) was added thereto to make the system have a pH of from 1.3 to 1.4. Next, this was stirred for 8 hours. The resulting liquid had a solid content of 9.5%, in which the polymer particles had a mean particle size of 0.4 μm.

The support 4-1 prepared in the above was coated with a coating liquid 4-1 for thermal recording layer mentioned below to such a degree that the dry weight of the coating layer could be 0.5 g/m$^2$, and dried in an oven at 100° C. for 60 seconds to form a thermal recording layer 4-1 thereon. This is a planographic printing plate precursor of Example 4-1.

| Coating liquid 4-1 for thermal recording layer: | |
|---|---|
| Polymer particles produced in the above | 5 g (as solid) |
| Polyhydroxyethyl acrylate (having a weight-average molecular weight of 25,000) | 0.5 g |
| IR absorbent dye (IR-11 having the structure mentioned below) | 0.3 g |
| Water | 100 g |

IR-11

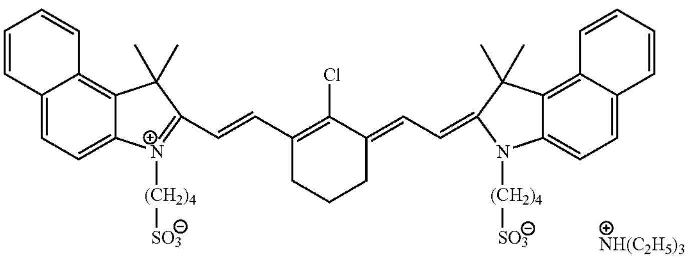

Example 4-2

A planographic printing plate precursor of Example 4-2 was fabricated in the same manner as in Example 4-1, for which, however, a coating liquid 4-2 for thermal recording layer that contains microcapsules of a thermo-reactive functional group-having compound prepared in the manner mentioned below was used for forming the thermal recording layer.

Production of Microcapsules of Thermo-reactive Functional Group-having Compound:

40 g of xylylene diisocyanate, 10 g of trimethylolpropane diacrylate, 10 g of allyl methacrylate/butyl methacrylate copolymer (molar ratio 7/3), and 0.1 g of surfactant (trade name: Paionin A41C, manufactured by Takemoto Oil & Fat Co., Ltd) were dissolved in 60 g of ethyl acetate. This is an oily phase component. 120 g of an aqueous 4% solution of polyvinyl alcohol (trade name; PVA205, manufactured by Kuraray) was prepared. This is an aqueous phase component. The oily phase component and the aqueous phase component were emulsified with a homogenizer at 10000 rpm. Next, 40 g of water was added thereto, and this was further stirred for 30 minutes at room temperature and for 3 hours at 40° C. The thus-obtained microcapsule suspension had a solid content of 20%, and the mean particle size of the microcapsules therein was 0.5 μm.

A coating liquid 4-2 for thermal recording layer mentioned below was applied to the same support 4-1 for planographic printing plates as in Example 4-1, to such a degree that the dry weight of the coating layer could be 0.5 g/m$^2$. After thus coated, this was dried in an oven at 100° C. for 60 seconds to form a thermal recording layer4-2 thereon. Thus fabricated, this is a planographic printing plate precursor of Example 4-2.

| Coating liquid 4-2 for thermal recording layer: | |
|---|---|
| Microcapsules produced in the above | 5 g (as solid) |
| Trimethylolpropane triacrylate | 3 g |
| IR absorbent dye (IR-11 mentioned above) | 0.3 g |
| Water | 60 g |
| 1-Methoxy-2-propanol | 40 g |

Example 4-3

A planographic printing plate precursor of Example 4-3 was fabricated in the same manner as in Example 4-1, for which, however, a coating liquid 3 for hydrophilic polymer-containing layer mentioned below was used for forming the hydrophilic polymer-containing layer.

| Coating liquid 3 for hydrophilic polymer-containing layer: | |
|---|---|
| Acrylamide macromonomer (P-2) | 1 g |
| Acrylamide | 1 g |
| Water | 18 g |

Example 4-4

A planographic printing plate precursor of Example 4-4 was fabricated in the same manner as in Example 4-2, for which, however, the coating liquid 3 for hydrophilic polymer-containing layer used in Example 4-3 was used for forming the hydrophilic polymer-containing layer.

Comparative Example 4-1

A planographic printing plate precursor of Comparative Example 4-1 was fabricated in the same manner as in Example 4-1, for which, however, an aluminium support of which the surface had been hydrophilicated through silicon treatment was used for the hydrophilic surface-having support.

Preparation of Hydrophilic Support of Aluminium:

An aluminium sheet (JIS A1050 ally, that comprises at least 99.5% aluminium, 0.30% Fe, 0.10% Si, 0.02% Ti and 0.013% Cu, and having a thickness of 0.24 mm) was electrolytically sand-grained in a nitric acid bath in an ordinary manner, then subjected to anodic oxidation in a sulfuric acid bath, and then further processed with an aqueous silicate solution. Ra (center line surface roughness) of the support was 0.25 μm; the amount of the oxide film formed through anodic oxidation on the support was 2.5 g/m$^2$, and the amount of silicon having adhered to the support was 10 mg/m$^2$.

Plate Making and Evaluation of Planographic Printing Plate:

Each of planographic printing plate precursors fabricated in Examples 4-1 to 4-4 and Comparative Example 4-1 that are developable in printers was exposed to a lighting appliance (trade name: Trend Setter 3244VFS, manufactured by Creo), and then directly set on the cylinder of a printer (trade name: SOR-M, manufactured by Heidelberg) without being processed. Thus with the precursor therein, dampening water and then ink were fed to the printer, and the printer was driven with paper being fed thereinto.

The amount of exposure necessary for forming prints from the printing plate was measured, and this indicates the recording sensitivity of each precursor. The printing plate from each precursor that had been exposed to the measured degree was tried in the printer as to how many good prints could be obtained with it, and the data indicate the printing service durability of the printing plate from the precursor. The test results are given in Table 1 below.

TABLE 1

| | Support | Thermal Recording Layer | | Sensitivity (mJ/cm$^2$) | printing service durability |
|---|---|---|---|---|---|
| Example 4-1 | Hydrophilic Surface 1 | Thermal Recording Layer 1 | Polymer Particles | 300 | 20,000 |
| Example 4-2 | Hydrophilic Surface 1 | Thermal Recording Layer 2 | Microcapsules | 300 | 20,000 |
| Example 4-3 | Hydrophilic Surface 2 | Thermal Recording Layer 1 | Polymer Particles | 300 | 20,000 |

TABLE 1-continued

| | Support | Thermal Recording Layer | | Sensitivity (mJ/cm$^2$) | printing service durability |
|---|---|---|---|---|---|
| Example 4-4 | Hydrophilic Surface 2 | Thermal Recording Layer 2 | Microcapsules | 300 | 20,000 |
| Comp. Ex. 4-1 | Hydrophilicated A1 Sheet | Thermal Recording Layer 1 | Polymer Particles | 700 | 10,000 |

From the data as above, it is understood that the planographic printing plate precursor of the invention enables high-density recording thereon, and the printing service durability of the printing plate from it is good. On the other hand, it is also understood that the planographic printing plate precursor of Comparative Example 4-1 in which the support is a conventional hydrophilicated aluminium sheet is inferior to the planographic printing plate precursor of the invention in which the support has a hydrophilic surface made of a polymerizing group-having hydrophilic graft polymer, in point of both the image-forming sensitivity of the precursor and the printing service durability of the printing plate from the precursor.

What is claimed is:

1. A method of producing a hydrophilic pattern-formed member, comprising the steps of:

forming, on a support, a layer containing a hydrophobic polymer capable of manifesting the ability to initiate polymerization with the application of energy;

forming, on the hydrophobic layer, a solid layer containing a hydrophilic polymer having a polymerizing group at a terminal end of the main chain and/or side chains of the hydrophilic polymer; and applying energy to the layers, in a patterned configuration, thereby forming reactive sites which are reactive to polymerization at an energy-applied portion of the layer containing the hydrophobic polymer and allowing the polymerizing group of the hydrophilic polymer to be bonded to the reactive sites, to obtain a hydrophilic pattern-formed member.

2. The method of producing a hydrophilic pattern-formed member according to claim 1, wherein a hydrophilic member is obtainable by direct binding of the polymerizing group of the hydrophilic polymer to the layer of the hydrophobic polymer by the ability to initiate polymerization manifested by energy application.

3. The method of producing a hydrophilic pattern-formed member according to claim 2, wherein the hydrophilic polymer comprises a polymerizing group at a terminal of the main chain thereof.

4. The method of producing a hydrophilic pattern-formed member according to claim 2, wherein the hydrophilic polymer comprises a polymerizing group in a side chain thereof.

5. The method of producing a hydrophilic pattern-formed member according to claim 3, wherein the hydrophilic polymer comprises a polymerizing group in a side chain thereof.

6. The method of producing a hydrophilic pattern-formed member according to claim 2, wherein the hydrophilic member is usable as a pattern forming material for forming a hydrophilic pattern through imagewise energy application.

7. The method of producing a hydrophilic pattern-formed member according to claim 6, wherein the layer containing the hydrophobic polymer contains a compound capable of manifesting the ability to initiate polymerization through energy application.

* * * * *